(12) United States Patent
Rigby et al.

(10) Patent No.: US 8,009,072 B2
(45) Date of Patent: Aug. 30, 2011

(54) PREDICTIVE ANALOG-TO-DIGITAL CONVERTER AND METHODS THEREOF

(75) Inventors: Kenneth Wayne Rigby, Clifton Park, NY (US); Robert Gideon Wodnicki, Niskayuna, NY (US); Krishnakumar Sundaresan, Albany, NY (US); Naresh Kesavan Rao, Clifton Park, NY (US)

(73) Assignee: General Electric Company, Niskayuna, NY (US)

( * ) Notice: Subject to any disclaimer, the term of this patent is extended or adjusted under 35 U.S.C. 154(b) by 0 days.

(21) Appl. No.: 12/642,780

(22) Filed: Dec. 19, 2009

(65) Prior Publication Data

US 2011/0148682 A1    Jun. 23, 2011

(51) Int. Cl.
H03M 3/00    (2006.01)
H03M 1/12    (2006.01)
H03M 1/10    (2006.01)

(52) U.S. Cl. ........ 341/143; 341/155; 341/118; 341/119; 341/120

(58) Field of Classification Search .......... 341/117–120, 341/131, 139, 143, 155, 156
See application file for complete search history.

(56) References Cited

U.S. PATENT DOCUMENTS

| | | | |
|---|---|---|---|
| 4,017,849 A | | 4/1977 | Tewksbury |
| 4,133,006 A | * | 1/1979 | Iinuma ............... 375/240.14 |
| 4,317,208 A | | 2/1982 | Araseki et al. |
| 4,849,758 A | | 7/1989 | Rosebrock |
| 4,972,189 A | * | 11/1990 | Polito et al. .............. 341/118 |
| 4,999,627 A | | 3/1991 | Agazzi |
| 5,187,481 A | * | 2/1993 | Hiller ..................... 341/131 |
| 5,206,647 A | * | 4/1993 | Stone ..................... 341/139 |
| 5,266,952 A | | 11/1993 | Stone et al. |
| 6,100,834 A | | 8/2000 | Lewyn |
| 6,229,469 B1 | | 5/2001 | Gaudet |
| 6,590,513 B2 | | 7/2003 | Stetson et al. |
| 6,891,488 B1 | | 5/2005 | McDaniel et al. |
| 7,187,237 B1 | | 3/2007 | Diorio et al. |
| 7,199,738 B2 | | 4/2007 | Han et al. |
| 7,280,063 B2 | | 10/2007 | Ozalevli et al. |
| 2004/0233091 A1 | | 11/2004 | Clement et al. |
| 2006/0158365 A1 | | 7/2006 | Kernahan et al. |

OTHER PUBLICATIONS

Hyde et al., "A Floating-Gate Trimmed, 14-Bit, 250 Ms/s Digital-to-Analog Converter in Standard 0.25urn CMOS", 2002 Symposium on VLSI Circuits Digest of Technical Papers, pp. 328-331, 2002.

Blomme et al., Scalable Floating Gate Flash Memory Cell With Engineered Tunnel Dielectric and High-K (Al2O3) Interpoly Dielectric, IEEE, 2 pages, 2006.

(Continued)

Primary Examiner — Jean B Jeanglaude
(74) Attorney, Agent, or Firm — Scott J. Asmus

(57) ABSTRACT

Predictive Analog-to-Digital Converter system in one embodiment includes a sampling section producing a sampled analog input signal with a first summer section combining the sampled analog input signal and an analog prediction signal to produce an analog prediction error signal. There is at least one error analog-to-digital convertor digitizing the analog prediction error signal, wherein a digital error signal output from the error analog-to-digital convertor is one of a full bitwidth error signal during an over-range condition else a lower bitwidth error signal. A second summer is coupled to the digital error signal output and a digital prediction signal, and generates a full bitwidth digital output signal. A feedback section is coupled to the digital output signal and providing the digital prediction signal and the analog prediction signal.

28 Claims, 24 Drawing Sheets

OTHER PUBLICATIONS

Srinivasan et al., "A Compact Programmable CMOS Reference With +/− 40uV Accuracy", IEEE 2006 Custom Intergrated Circuits Converence (CICC), pp. 611-614, Oct. 2006.

Daft et al., "A Matrix Transducer Design With Improved Image Quality and Acquisition Rate", 2007 IEEE Ultrasonics Symposium, pp. 411-415, 2007.

Cyganski et al., "Optimum Design, Performance Evaluation, and Inherent Limitations of DPCM Encoders", IEEE Transactions on Circuits and Systems, vol. CAS-25, No. 7, pp. 448-460, Jul. 1978.

Echoescan Predictive ADC, obtained from the URL http://www.echoescan_com/Predictor.htm on Nov. 22, 2009, 1 page.

Samplify SAM1600 Family, obtained from the URL http://www.echoescan.com/Predictor.htm on Nov. 22, 2009.

Boe et al., "Predictive Analog to Digital Conversion of Doppler Ultrasound Signals", IEEE Transactions on Biomedical Engineering, vol. 42, No. 3, pp. 260-268, Mar. 1995.

* cited by examiner

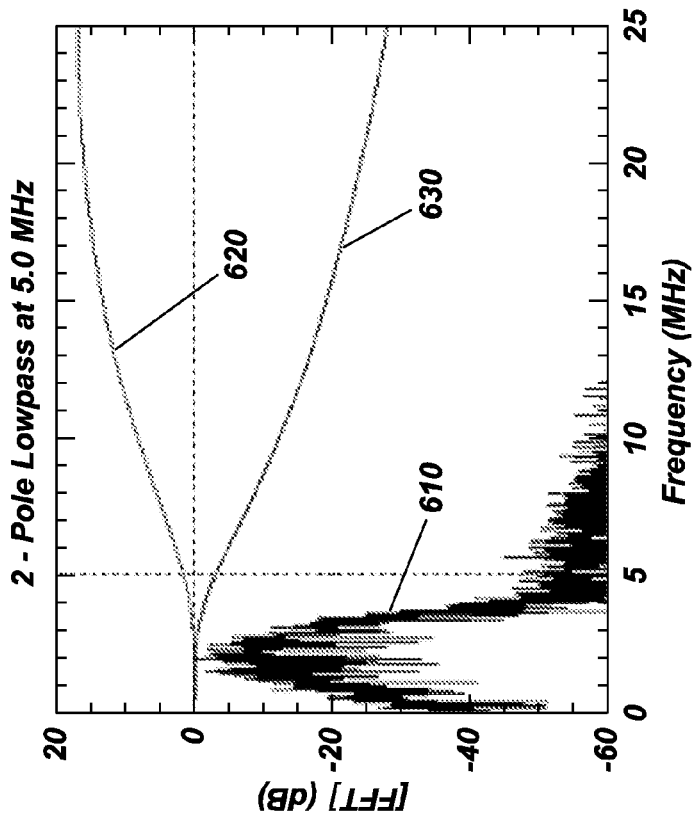
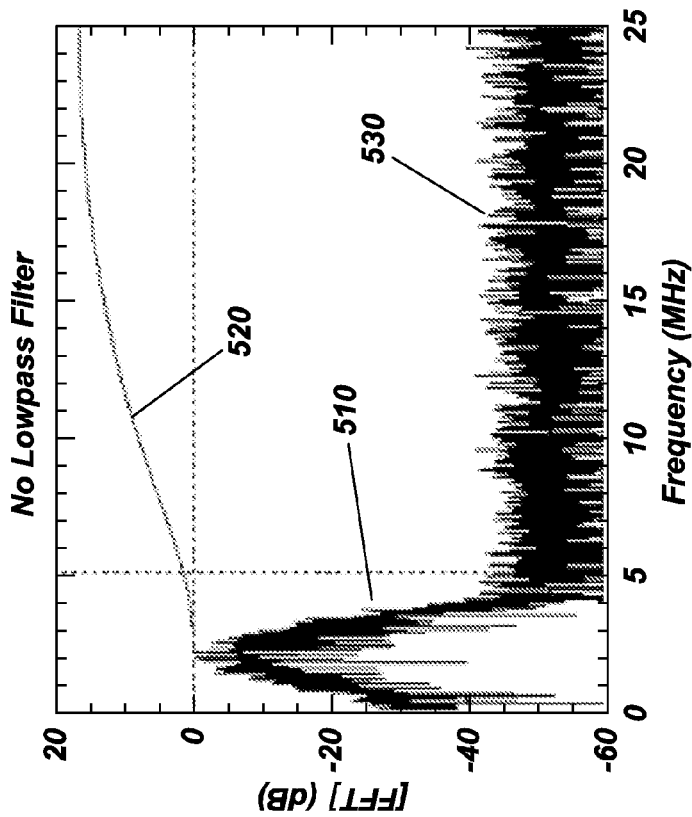
Fig. 6
Fig. 5

|  | $E_0$ m-Bit | $E_1$ n-Bit m-Bit |  |
|---|---|---|---|
|  | 1 x 18<br>18 | 2 x 16 + 1 x 18<br>50 | (4+)-Bit / 4-Bit subranging |
|  | 1 x 8<br>8 | 3 x 8 + 1 x 8<br>32 | 3-Bit / 3-Bit subranging |
|  | 1 x 16<br>16 | 3 x 8 + 1 x 16<br>40 | 4-Bit / 3-Bit subranging |

*Fig. 15*

PREDICTIVE ANALOG-TO-DIGITAL CONVERTER AND METHODS THEREOF

BACKGROUND

The predictive analog-to-digital converter (ADC) architecture was proposed in the 1970's. The method digitizes the difference between the signal to be converted and a prediction of that input signal. When the prediction is of high quality, the difference signal will be small and can be digitized using an ADC with fewer bits than would otherwise be required to digitize the input signal. A number of variations have been proposed but with few commercial implementations. One reason is that the output becomes unreliable and even unstable when the difference signal, which is the prediction error, exceeds the range of the error ADC. This can happen under several conditions such as when the prediction is inaccurate and when the input signal exceeds the design range of the converter. The problem can also occur when the converter first starts converting the input signal since the prediction circuitry commonly requires some number of samples to produce the first valid prediction.

A commonly used method of prediction is a linear filter using past samples. Such prediction filters are designed assuming a band-limited signal. They have gain in the stop-band, so that any out-of-band noise in the input signal is amplified. This typically increases the magnitude of the difference signal, requiring more bits in the error ADC and thus increasing power consumption and size.

Thus, there is a continuing problem with the reliability of predictive ADC. Another issue relates to the power consumption and size requirements of improvements to the predictive ADC to attempt to improve reliability.

BRIEF DESCRIPTION

One embodiment is a predictive analog-to-digital converter system, including a sampling section producing a sampled analog input signal with a first summer section combining the sampled analog input signal and an analog prediction signal to produce an analog prediction error signal. There is at least one error analog-to-digital convertor digitizing the analog prediction error signal, wherein a digital error signal output from the error analog-to-digital convertor is one of a full bitwidth error signal during an over-range condition else a lower bitwidth error signal. A second summer is coupled to the digital error signal output and a digital prediction signal, and generates a full bitwidth digital output signal. There is a feedback section coupled to the digital output signal and providing the digital prediction signal and the analog prediction signal. The feedback section in one example includes a prediction filter for calculating the digital prediction signal and a digital-to-analog converter providing the analog prediction signal.

In one example, the error analog-to-digital convertor includes a lower bitwidth analog-to-digital converter producing a lower bitwidth digital error signal, a full bitwidth analog-to-digital converter producing a full bitwidth digital error signal, and an over-range detector for processing the over-range condition.

One embodiment is a method for producing a full bitwidth output using a predictive analog-to-digital converter, comprising sampling an analog input signal to generate a sampled analog input signal, and calculating an analog prediction error signal by combining an analog prediction signal with the sampled analog input signal. If the analog prediction error signal is within a range of a lower bitwidth analog-to-digital converter, digitizing the analog prediction error signal with the lower bitwidth analog-to-digital converter producing a lower bitwidth error signal and adding the lower bitwidth error signal to a prediction signal, and outputting the full bitwidth output. However, if the analog prediction error signal is not within the range of the lower bitwidth analog-to-digital converter, performing one of digitizing the analog prediction error signal with a full bitwidth analog-to-digital converter producing a full bitwidth error signal and adding the full bitwidth error signal to the prediction signal and outputting the full bitwidth output or digitizing the sampled input signal with a full bitwidth analog-to-digital converter and outputting the full bitwidth output. Furthermore, processing the full bitwidth output in a feedback section to produce the prediction signal and the analog prediction signal.

An additional embodment is predictive analog-to-digital converter producing a full bitwidth digital output, including a sampling section producing a sampled analog input signal from an analog input signal, and a first summer for producing an analog prediction error signal as the difference between the sampled analog input signal and an analog prediction signal. An error analog-to-digital convertor is coupled to the first summer, and includes at least one analog-to-digital converter for producing a prediction error signal. An over-range detector determines whether the prediction error signal is outside a range of the analog-to-digital converter, wherein a digital error signal from the error analog-to-digital convertor is one of a full bitwidth digital error signal when the prediction error signal is outside the range or a low bitwidth digital error signal when the prediction error signal is within range. There is a second summer coupled to the digital error signal and a digital prediction signal, and producing the full bitwidth digital output. A feedback section is coupled to the full bitwidth digital output comprising a prediction filter for producing the digital prediction signal and a digital-to-analog converter for producing the analog prediction signal.

Another embodiment is a predictive analog-to-digital converter producing a full bitwidth output, having a sampling section producing a sampled analog input signal from an analog input signal with a first summer for producing an analog prediction error signal as the difference between the sampled analog input signal and an analog prediction signal. There is at least one analog-to-digital converter coupled to the first summer for producing a prediction error signal and an over-range detector that determines whether the prediction error signal is outside a range of the analog-to-digital converter. If the prediction error signal is not within the range, digitizing the analog input signal to produce the full bitwidth output. However, if the prediction error signal is within range, adding a digitized analog prediction error signal with the digital prediction signal to produce the full bitwidth output. There is a feedback section coupled to the full bitwidth output comprising a prediction filter for producing the digital prediction signal and a digital-to-analog converter for producing the analog prediction signal.

The features and advantages described herein are not all-inclusive and, in particular, many additional features and advantages will be apparent to one of ordinary skill in the art in view of the drawings, specification, and claims. Moreover, it should be noted that the language used in the specification has been principally selected for readability and instructional purposes, and not to limit the scope of the inventive subject matter.

BRIEF DESCRIPTION OF THE DRAWINGS

The invention will be more clearly understood from the following description wherein one or more embodiments are illustrated, by way of example only, with reference to the accompanying drawings, wherein like reference numbers are used throughout the figures to indicate like features. Individual features in the figures may not be drawn to scale.

FIGS. 3a and 3b shows the amplitude and phase response of an example prediction filter from FIG. 1a;

FIG. 5 shows the power spectrum of a bandlimited signal centered at 2 MHz to which white noise has been added;

FIG. 6 shows the power spectrum of the lowpass filtered analog signal, the prediction filter gain and the analog filter gain in one example;

FIG. 8 shows the quantization error in LSBs for the same signal obtained by numerical simulation of FIG. 1a;

FIG. 15 shows the relative energy consumed by the predictive converter during a sample clock period for three configurations.

DETAILED DESCRIPTION

Figure 1A:
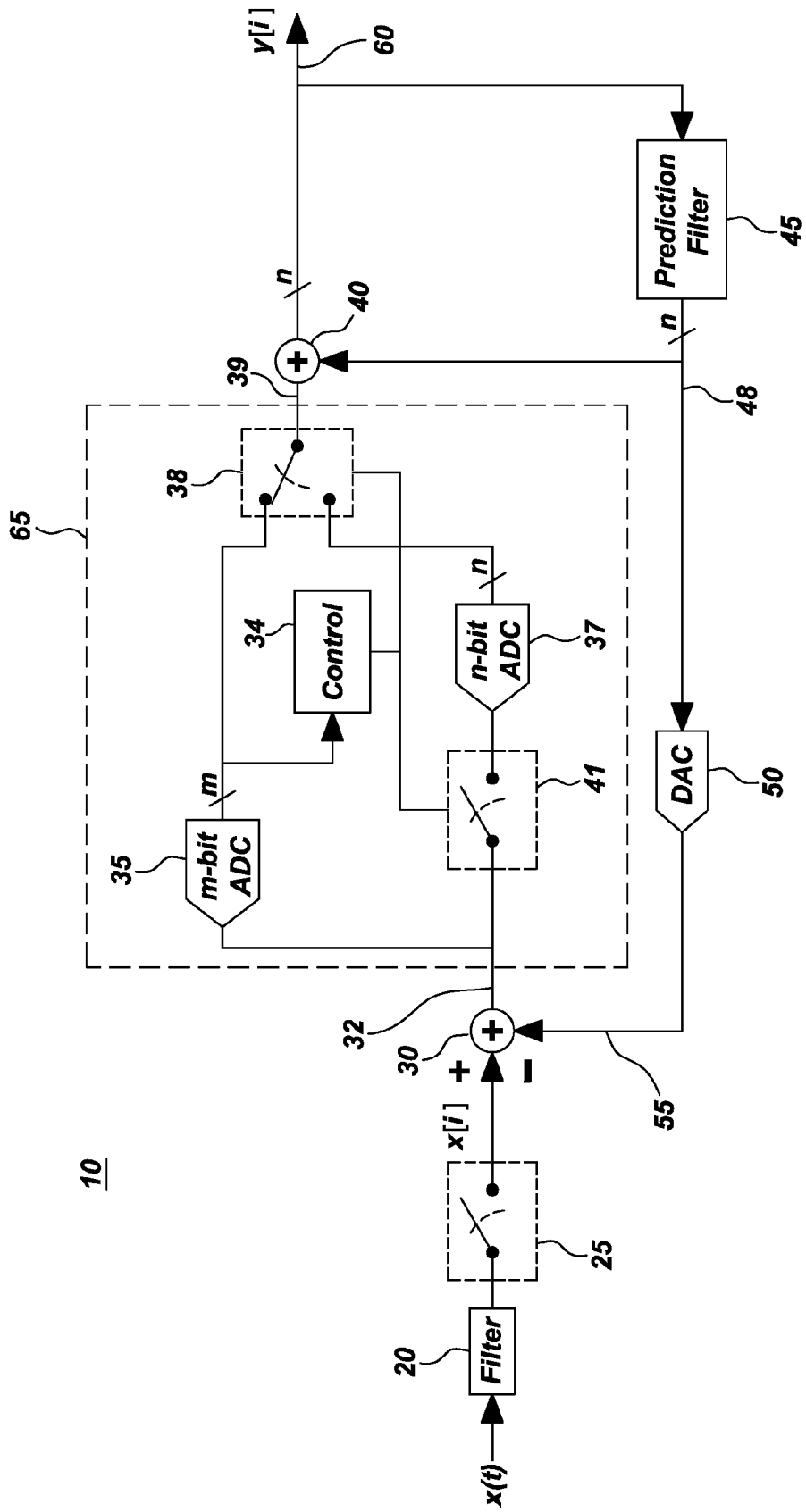
FIG. 1a is a block diagram of a predictive ADC system according to one embodiment.

In the following detailed description, numerous specific details are set forth in order to provide a thorough understanding of various embodiments of the present system and methods of operation. However, those skilled in the art will understand that embodiments may be practiced without these specific details, that the present system is not limited to the depicted embodiments, and that the present system may be practiced in a variety of alternative embodiments. In other instances, well known methods, procedures, and components have not been described in detail.

Furthermore, various operations may be described as multiple discrete steps performed in a manner that is helpful for understanding embodiments of the present system. However, the order of description should not be construed as to imply that these operations need be performed in the order they are presented, nor that they are even order dependent. Moreover, repeated usage of the phrase "in one embodiment" does not necessarily refer to the same embodiment, although it may. Lastly, the terms "comprising", "including", "having", and the like, as well as their inflected forms as used in the present application, are intended to be synonymous unless otherwise indicated.

In a general sense, the present system solves the problem of the conventional art of a reliable low power predictive analog-to-digital converter (ADC) by digitizing the prediction error signal or, in an alternative embodiment, the input signal, to the full bitwidth of the predictive ADC whenever it exceeds the reduced bit-width range of the error ADC.

The system in one embodiment is a low power, small-area, ADC for nominally bandlimited signals with noise. Under certain conditions the converter uses a small bit-width ADC (the "core ADC") to digitize the difference between the input signal and an analog prediction signal, where the prediction signal is obtained by linearly filtering past samples of the digitized output signal and then converting the digital prediction signal to an analog voltage using a digital-to-analog converter (DAC). If the difference signal exceeds the range of the small bit-width ADC, circuitry is provided in one example to digitize it to the full desired bit-width. The output of the converter in one example is the sum of the prediction signal and the digitized difference signal. An analog filter can be provided to improve the performance of the prediction filter when out-of-band noise is present. In more particular detail, a bandwidth reduction filter is used in some embodiments to filter out noise and may be a low-pass filter, a band pass filter or a high-pass filter depending upon the application and environment.

Among the advantages of system these include a reduction in the power and size with respect to conventional ADCs because the difference signal is typically much smaller in magnitude than the input signal, so that the small bit-width ADC can have many fewer bits than the output. As used herein, the term "predictive ADC" refers to the system that produces an n-bit representation of the input signal. The term "error ADC" refers to the subsystem that produces either an m- or n-bit representation of the prediction error, where 'm' is less than 'n'. The term "core ADC" refers to an ADC which produces an m-bit value.

FIG. 1a shows a block diagram of one embodiment of the present predictive ADC architecture 10 wherein a general feature of the system is the ability to digitize the prediction error signal to the full bitwidth of the predictive ADC when necessary or otherwise established by certain parameters or limits. The analog signal x(t) to be digitized passes through an optional analog filter 20, such as a low pass filter to remove extraneous noise at the higher frequencies. A sampling section 25 allows the filtered analog signal x(t) to be sampled at some desired sampling frequency providing the sampled analog signal x[i].

The sampled analog signal x[i] is an input to an summer 30 along with the analog predicted signal 55 calculated using prior samples. The analog prediction error signal 32 is the difference, calculated in the summer circuit 30, between the sampled analog input x[i] and the analog predicted signal 55. As used herein, summer applies to the combining of analog or digital signals. The prediction error signal 32 is digitized to either m bits, in the low-power mode, or to n bits, in the over-range mode, in the error ADC 65.

One advantage of predictive ADC over conventional ADC architectures is that, for a desired number of output bits and a given quantizer resolution, the error ADC can be implemented using many fewer bits at the same quantizer resolution. This reduces the size and power consumption of the converter. Stated another way, the typical voltage range of the signal at the input of the error ADC can be much smaller than the fullscale voltage range of the signal at the input to the predictive ADC.

Unfortunately, the prediction error signal can greatly exceed its typical range in certain circumstances, and this has limited the usefulness of the conventional predictive ADC. For example, the predicted signal will generally be inaccurate for several samples at beginning of the input signal, since the prediction filter requires several past samples to produce an accurate prediction. As another example, the predicted signal will be inaccurate whenever the input signal exceeds the design input voltage range of the predictive converter. In both of these circumstances, the digitized form of the difference signal will be grossly incorrect if the analog difference signal exceeds the range of the reduced bit-width ADC that digitizes the difference signal, and the digital prediction filter will necessarily produce a grossly inaccurate prediction for the next sample. Even more seriously, once a grossly inaccurate prediction is generated and used, it is likely that all subsequent predictions will be grossly inaccurate for any input signal, as the grossly inaccurate digital representations of the output propagate through the feedback loop in the predictive ADC. These stability problems are known phenomenon in quantized systems with feedback.

Referring again to FIG. 1a, the control section 34 addresses the stability problem in the feedback path by determining how the prediction error signal 32 is to be processed. According to one embodiment, there are two modes: a low power mode, in which the input is converted to an m-bit digital value by an m-bit ADC 35, with m<n; and an over-range mode, in which the input is converted to an n-bit digital value with n-bit ADC 37. According to one example, the over-range mode is used when the error in the predicted signal is larger than m bits, as described herein. This processing stabilizes the predictive ADC in the presence of over-range input signals and inaccurate predictions and also addresses the prediction signal initialization problem.

If the digitized prediction error signal produced by m-bit ADC 35 is within the m-bit range, control section 34 causes the m-bit signal to be sent via multiplexer 38 to summer 40. The m-bit digitized error signal 39 is added in summer 40 to the digital prediction signal 48 calculated using prior output samples. The output of summer 40 is the n-bit digital output signal y[i] 60 processed in the low power mode.

The output signal y[i] 60 is used by prediction filter 45 to produce the prediction signal 48, which is added to the digitized prediction error signal as described. It is also converted by digital-to-analog converter (DAC) 50 to form the analog predicted signal 55 that is combined with sampled analog signal x[i] in summer 30 to generate the analog prediction error signal 32.

For the over-range mode, if the digitized prediction error signal produced by m-bit ADC 35 does not lie within the m-bit range, control section 34 passes the analog prediction error signal 32 to the n-bit ADC 37 via switch 41. The control section 34 causes the n-bit output of n-bit ADC 37 to be sent via multiplexer 38 to summer 40, where the digitized error signal 39 is added to the digital prediction signal 48. In this over-range mode, the digitized error signal 39 is an n-bit signal, whereas in the low-power mode, the digitized error signal 39 is an m-bit signal. In one example, the over-range detector performs the required processing of determining whether the signal is going to be within the range of the applicable ADC or over-range.

It is understood that the depiction of switches and multiplexers in the figures is for illustrative purposes as the switching functionality is also performed logically such as by enable signals.

There is a feedback aspect of the present system. The n-bit digital output signal y[i] 60 passes through a prediction filter 45 as part of a feedback loop, producing the digital prediction signal 48. The digital prediction signal 48 is added to the digitized prediction error signal 39 (m-bit or n-bit) to produce the output signal y[i]. This digital prediction signal 48 is also converted to an analog voltage by a DAC 50 and is subtracted from the sampled analog input signal x[i] using summer 30.

Figure 1B:
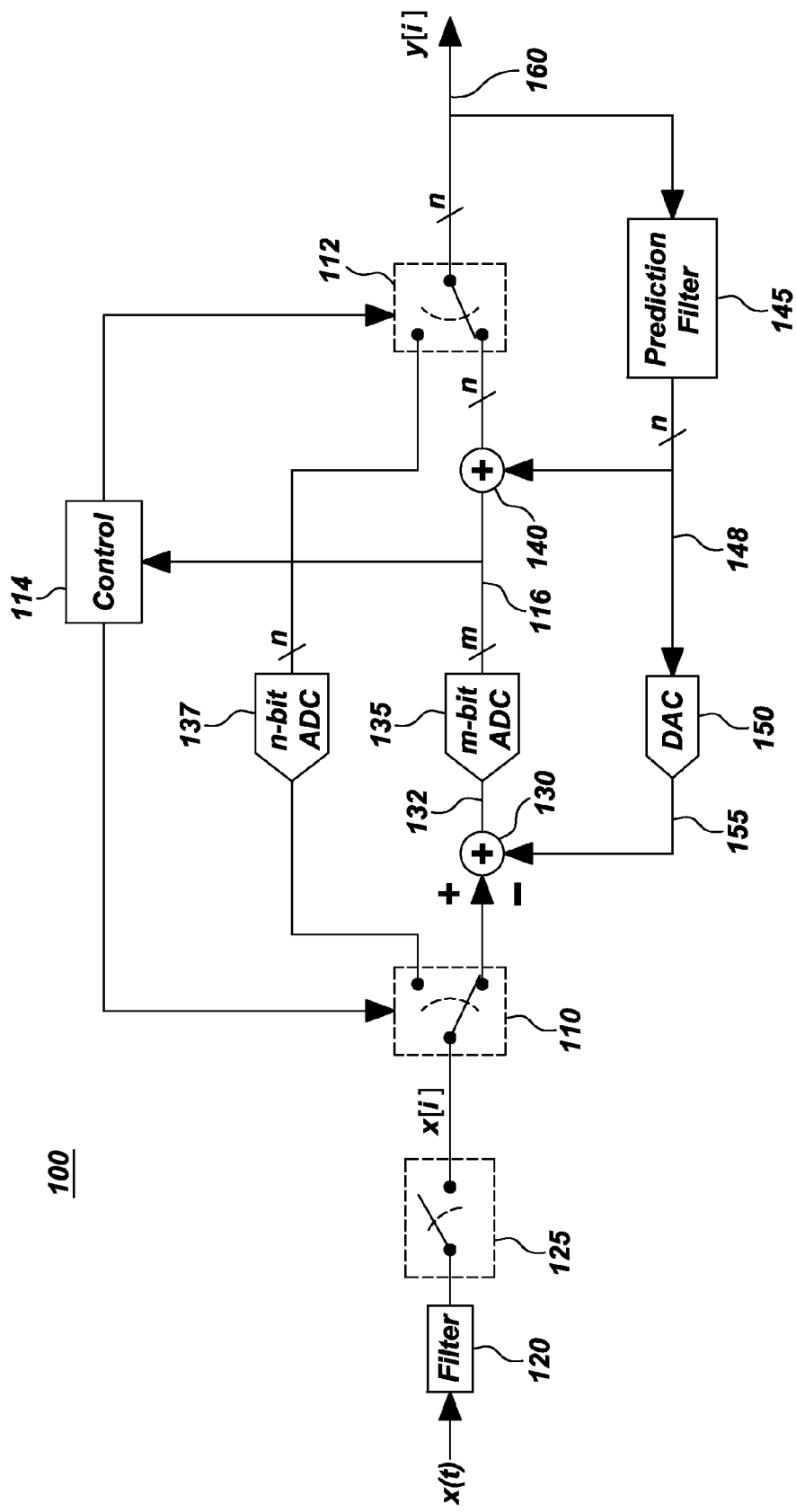
FIG. 1b is another block diagram showing an alternate embodiment for the predictive ADC system.

FIG. 1b depicts an alternate embodiment of a predictive ADC architecture 100. While FIG. 1a shows one embodiment wherein an analog prediction error signal is converted to a low bitwidth signal or full bitwidth signal, FIG. 1b shows an embodiment wherein the analog input signal can be directly converted to a full bitwidth signal.

Referring again to FIG. 1b, the analog signal x(t) is optionally filtered 120 and is sampled 125 to produce the sampled analog signal x[i]. In the low bitwidth mode, x[i] is connected via demultiplexer 110 under control of control section 114 to summer 130, where it is combined with the analog prediction signal 155 producing the analog prediction error signal 132. The analog prediction error signal is digitized in m-bit ADC 135 producing the m-bit digitized prediction error signal 116.

If the m-bit digitized prediction error signal 116 lies within the range of the m-bit ADC 135, the predictive converter 100 operates in the non-over-range mode or low bitwidth mode. The digitized prediction error signal is added to the digital prediction signal 148 in summer 140 and the result is connected via multiplexer 112 under control of control section 114 to the output signal y[i] 160. For the feedback processing, the output signal 160 is processed in the prediction filter 145 to produce the digital prediction signal 148, which is converted in DAC 150 to the analog prediction signal 155.

If the m-bit digitized prediction error signal 116 lies outside the range of the m-bit ADC 135, the predictive converter 100 operates in the over-range mode. In the over-range mode, control section 114 connects x[i] via demultiplexer 110 to n-bit ADC 137. The n-bit digitized output of ADC 137 is connected via multiplexer 112 under control of control section 114 to the output signal y[i] 160. For the feedback, the output signal 60 is processed in the prediction filter 145 to produce the digital prediction signal 148, which is converted in DAC 150 to the analog prediction signal 155.

Figure 2:
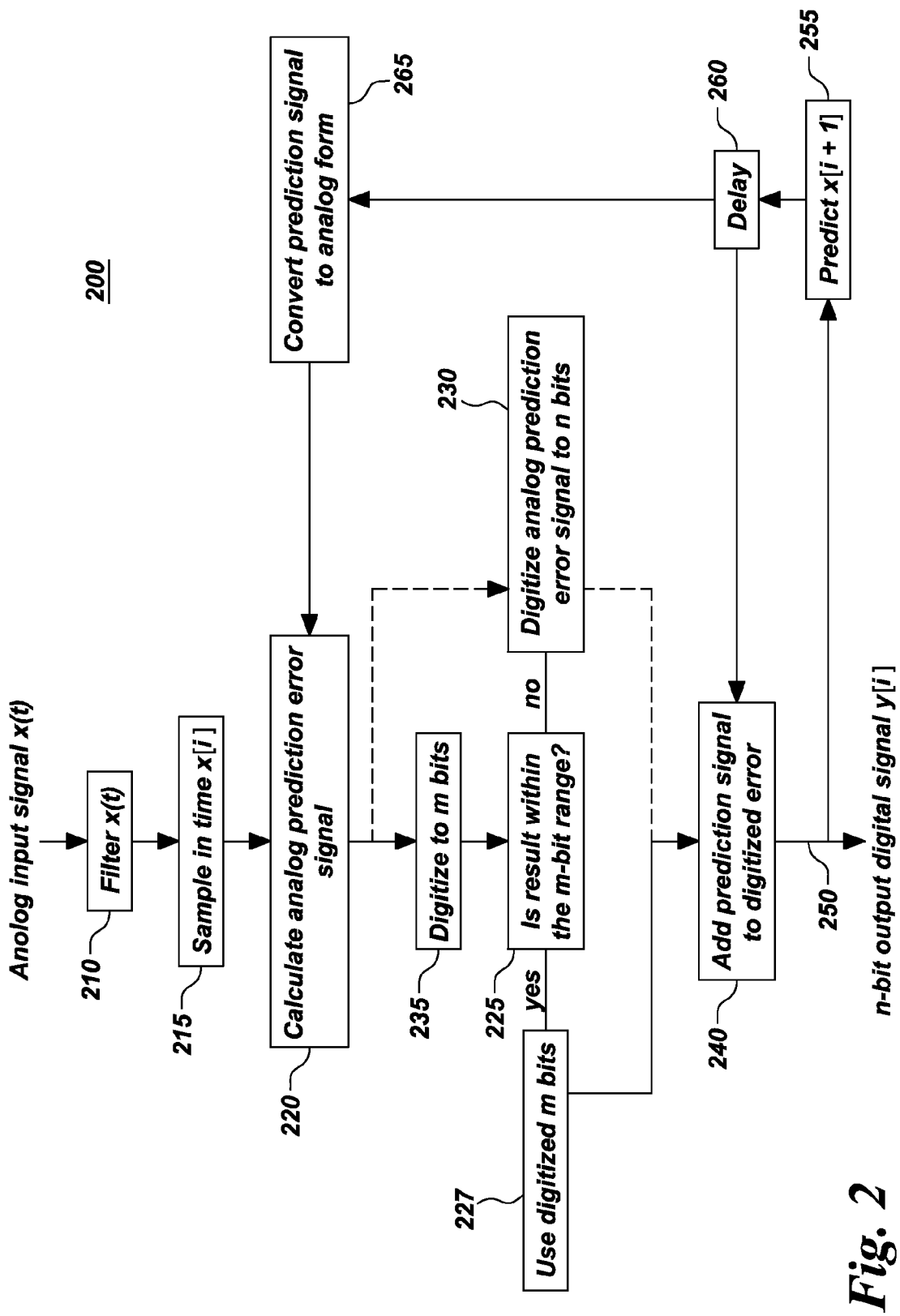
FIG. 2 is a flow chart of predictive ADC processing according to one embodiment.

Referring to FIG. 2, a flowchart of the predictive ADC processing in one embodiment of the predictive system is depicted. The analog input signal x(t) can be optionally filtered 210 to remove extraneous noise signals. One example is a low pass filter, but for some applications, depending upon the signal properties, a band pass or high pass filter is used and collectively the filtering is considered bandwidth reduction filtering. The analog input signal x(t) is sampled in time to generate a sampled analog input signal x[i] 215. The analog prediction error signal is calculated by subtracting an analog prediction signal from the analog sampled input signal, 220. This analog prediction error signal is then digitized into a digital prediction error signal that is a low bitwidth or m-bit signal 235 and subject to a control decision to determine whether the m-bit result is within an m-bit range 225 of the converter.

In one implementation, the result is considered as being over-range if it is either the lowest or the highest m-bit digital code, and within range otherwise. In another implementation, the analog prediction signal is compared to the analog voltages representing the most negative and most positive in-range values at the input of the m-bit converter and, if the analog signal lies outside those two voltages, the result is set to a reserved digital code, for example, the binary value consisting of all 1's, indicating that the result is considered as being over-range.

If the m-bit digital prediction error signal is within the m-bit range 225, then the m-bit digitized prediction error signal is used 227, and is added to the n-bit digital prediction sample 240. The resulting output is the n-bit digital output signal y[i] 250 corresponding to the sampled input signal x[i] 215. However, if the m-bit prediction error signal is not within the m-bit range 225, then the analog prediction error signal is digitized to n-bits 230 and added to the n-bit digital prediction sample 240. The resulting output is the n-bit digital output sample y[i] 250 corresponding to the sampled input signal x[i] 215.

As noted in FIG. 1b, an alternative processing does not require that digitization of the analog prediction error signal to n bits in the over-range mode. Rather, the analog signal can be directly digitized to n bits upon an over-range condition.

In one example, at any particular stage in the processing, a set of n-bit digital output samples y[i] 250 representing the analog input signal x[i] through a particular sample number i will have been produced. As part of the feedback processing, some or all of these n-bit digital output samples are processed, 255, to predict the value of the next analog input sample x[i+1]. In one implementation, this prediction is generated by filtering the samples y[i] with a finite-impulse-response (FIR) filter having integer weights arranged in a special form as described herein. The predicted value is delayed 260 to align it properly before it is used in subsequent feedback processing of the next analog input sample x[i+1]. The delayed predicted sample is added to the digitized m- or n-bit prediction error signal 240 as noted herein. The delayed prediction signal is also converted to its analog form 265 and fed back into the process where it is subtracted from the analog input sample to calculate the analog prediction error signal 220 as detailed herein. There are various other process permutations all within the scope of the present process.

Prediction Filter

The prediction filter 45 such as shown in FIG. 1a is designed so that it uses only past samples. In one example, the prediction filter output for sample i depends upon the samples y[i−1], y[i−2], y[i−3], etc. and not upon samples y[i], y[i+1], y[i+2], etc.

There are a variety of prediction filters that can be employed with the present system. For example, in Tewksbury and Hallock ["Oversampled, Linear Predictive and Noise-Shaping Coders of Order N>1," *IEEE Transactions on Circuits and Systems, Vol. CAS*-25, No. 7 (1978), pp. 436-447] a family of prediction filters is described that are particularly convenient to implement in digital hardware. These filters are a weighted sum of the past output samples y, with integer weights. For example, the filter with four coefficients in z-transform notation is $4z^{-1}-6z^{-2}+4z^{-3}-z^{-4}$.

Figure 3A:
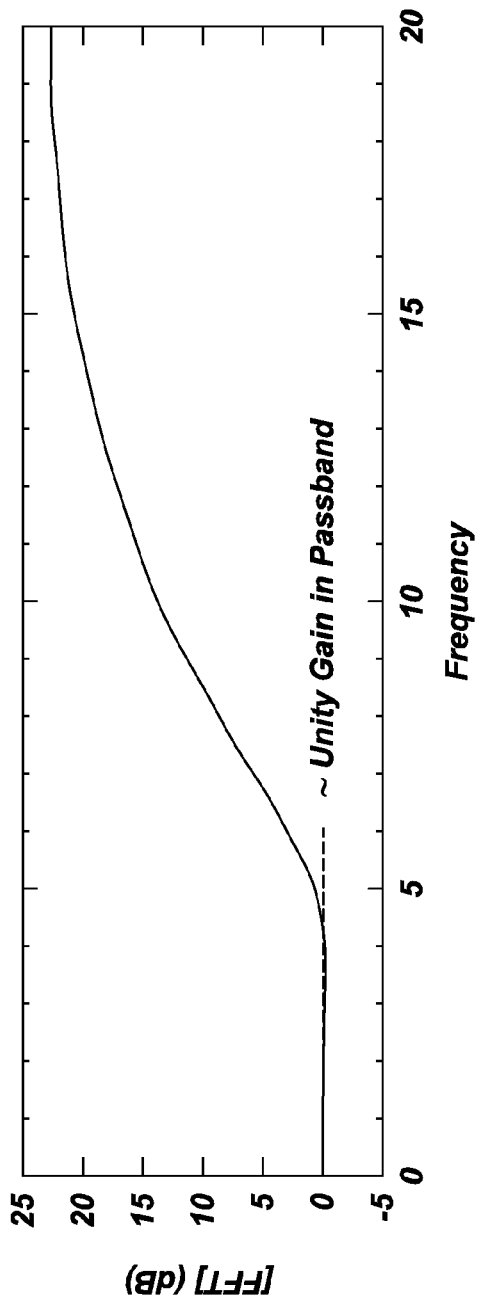
Figure 3B:
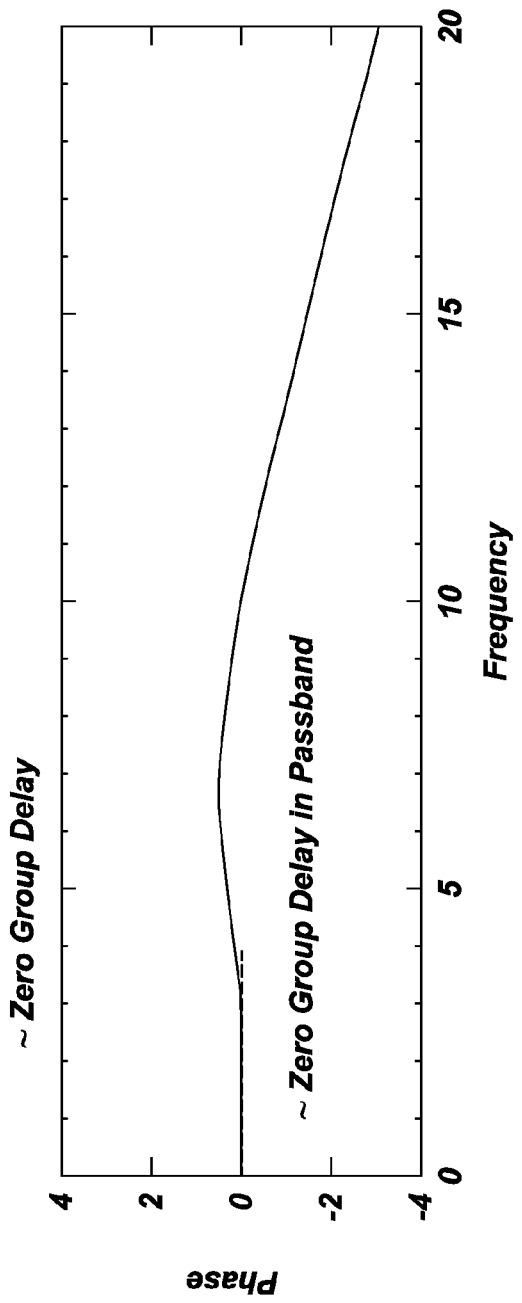

The amplitude and phase response of one such filter is shown in FIGS. 3a and 3b for a sampling frequency of 40 MHz. As shown in FIG. 3a, the filter gain is approximately unity over a passband of 0-5 MHz. Referring to FIG. 3b, the filter group delay is approximately zero over this range. These filters are finite impulse response (FIR) lowpass filters with integer coefficients and the special property that the coefficients for the center filter tap and earlier are identically zero, i.e., they utilize only past samples.

Other prediction filter design methods are known in the art. For example, Mugler, Wu and Clary ["Linear Prediction of Bandpass Signals Based on Past Samples", Proceedings of the International Workshop on Sampling Theory, Norway (1999) pp. 119-124], describe a method that produces non-integral coefficients. The prediction filter could be an infinite-impulse-response (IIR) filter instead of an FIR filter. The prediction filter could also be a low pass or band pass filter.

As detailed herein, the analog filter in one embodiment solves the problem of greater than unity gain of the prediction filter outside the passband. With respect to the power spectrum of a nominally bandlimited signal and the filter gain of the prediction filter, the prediction filter in one example has approximately unity gain for frequencies where the signal has significant power and gain greater than unity for frequencies where the signal has less significant power.

Figure 4:
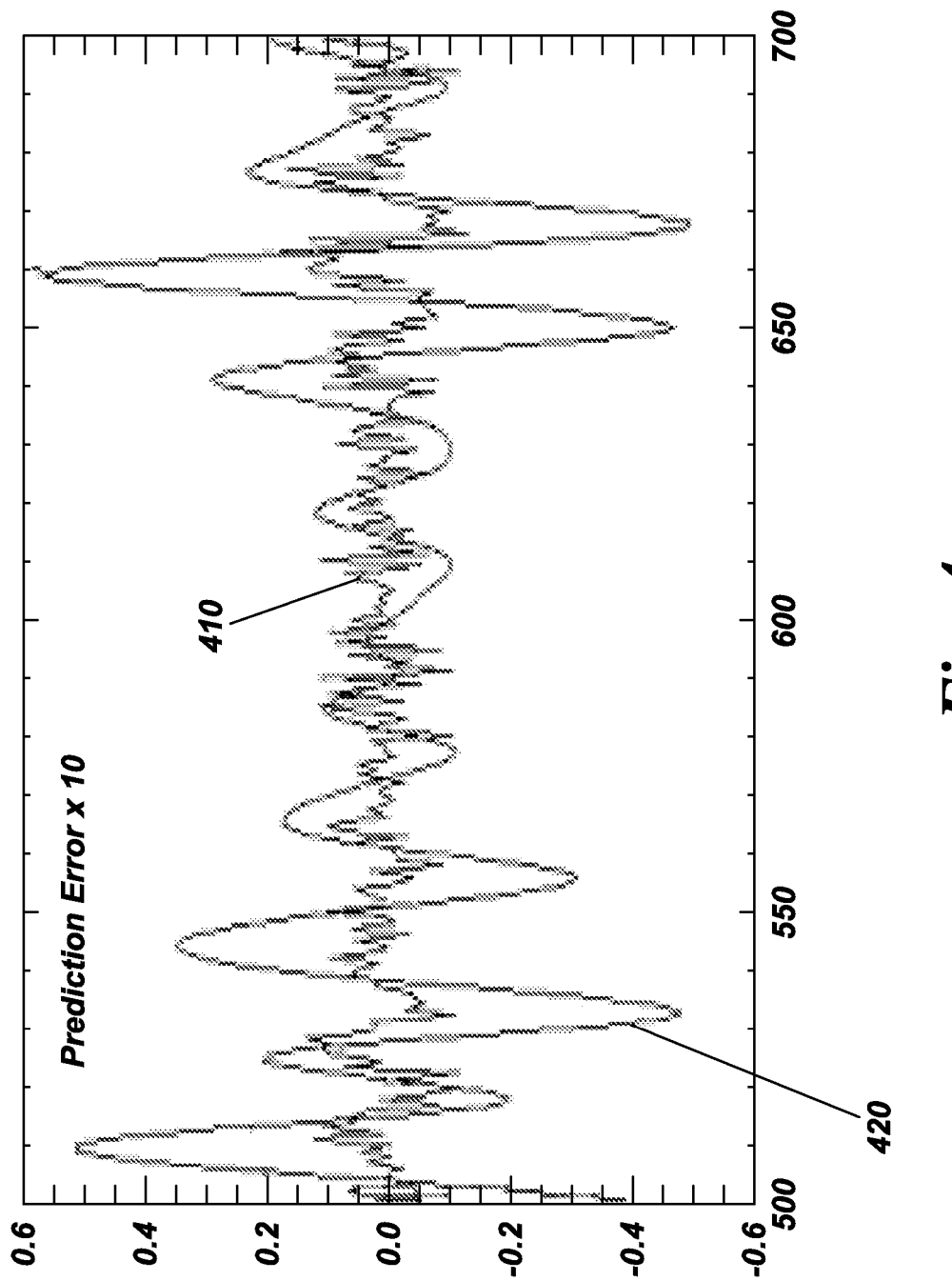
FIG. 4 illustrates a small region of an example bandlimited signal and the prediction error according to one embodiment.

FIG. 4 shows an example of a nominally band-limited signal 420 and the difference 410 between that signal and a prediction of that signal produced using a four-tap FIR filter with integer coefficients. In this example, the prediction error 410 is multiplied by ten. It can be seen that the prediction error is much smaller than the original signal.

Performance with Noisy Signals

All nominally bandlimited signals originating from physical processes will contain some level of out-of-band noise, for example, noise arising from resistive electronic components. This Johnson noise has a power spectrum that is approximately constant in frequency, i.e., is "white."

FIG. 5 shows the power spectrum of an example bandlimited signal 510 centered at 2 MHz to which white noise 530 has been added with no lowpass filtering The amplitude response of the prediction filter 520 is also shown. This signal was input to a numerical model of the circuitry in FIG. 1a using a sampling rate of 40 MHz and using n=10 bits. The input signal was scaled such that its root-mean-square (rms) value corresponded to eight bits at the output, and the four-tap prediction filter $4z^{-1}-6z^{-2}+4z^{-3}-z^{-4}$ was used. With no analog filtering of the input signal, 65% of the prediction error signal values were larger in magnitude than m=4 bits.

FIG. 6 shows the benefit of low-pass filtering the input analog signal with a two-pole filter with a cutoff frequency of 5 MHz. This figure shows the power spectrum of the filtered analog signal 610, the prediction filter gain 620 and the low-pass analog filter gain 630. The net gain of the prediction and analog filters is now less than unity in the stopband. With the two-pole analog filter, only 2% of the prediction error signal values exceed the four-bit range.

The fraction of prediction error samples exceeding the low-power, m-bit range of the error ADC shall be referred to as the over-range rate. Numerical modeling shows that for a given number of poles in the analog filter, the over-range rate increases as the noise level increases. For a given noise level, the over-range rate decreases as the number of poles increases. Since the power consumption and size of the analog filter increases with the number of poles, while the power consumption of the error ADC increases with the over-range rate, the optimal configuration of the analog filter can be chosen after consideration of the total power consumption of the converter.

Over-Range Handling

One feature of the present system is the ability to digitize the prediction error signal or, in another embodiment, the input signal, to the full bitwidth of the predictive ADC in an over-range mode. As is known in the art, feedback loops can become unstable if the signals exceed the dynamic range of the circuitry implementing the feedback loop. In particular, if the error ADC were only capable of producing an m-bit output, the output of the prediction filter could be grossly incorrect when the error signal exceeds the m-bit range. This in turn usually results in the next error signal exceeding the m-bit range. The result is often an output that is useless for the remainder of the input signal.

At the beginning of a signal, the error signal will generally be large because the past samples upon which the prediction filter relies are not yet available. The error signal can be artificially kept small in this situation by requiring that the input signal ramp up slowly in amplitude. But this is not a useful solution except in situations where the information in the beginning of the signal is unimportant. For ultrasound imaging as in many other applications, this is not the case.

Figure 8:
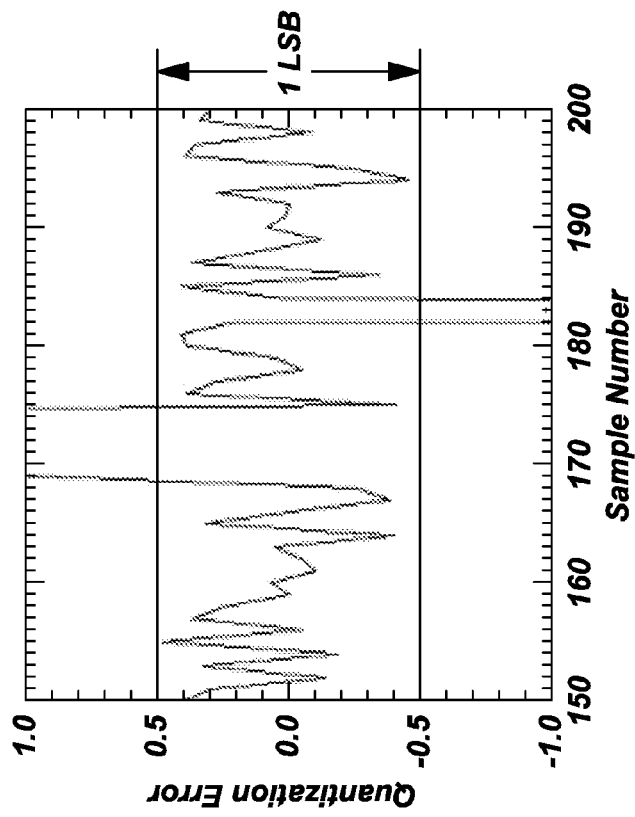
Figure 7:
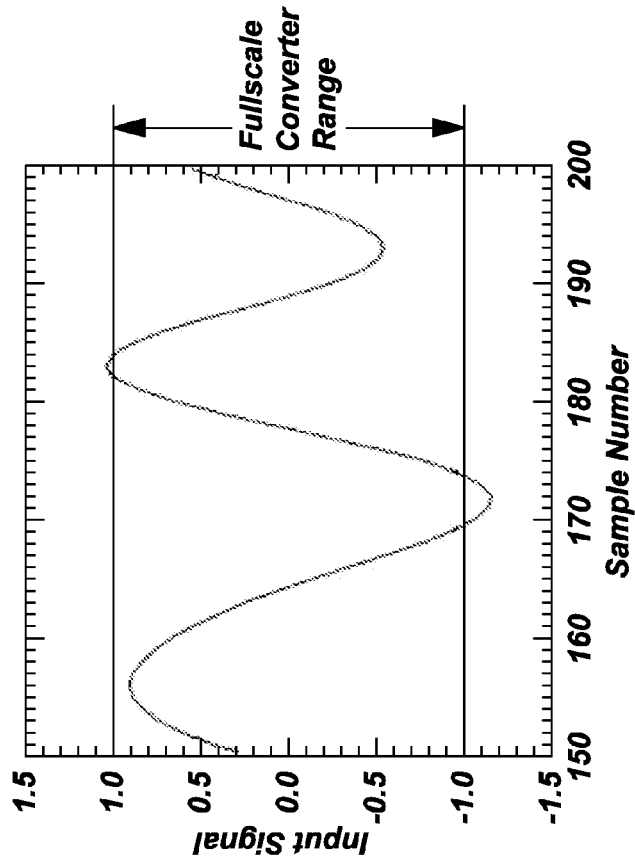
FIG. 7 shows a segment of an input signal which exceeds the design range of the converter.

When the error ADC is capable of producing a full n-bit output, or in another embodiment, when the input signal can be digitized to the full n-bit range, however, these problems are eliminated. In this case the converter is stable even when the input signal exceeds the design range of the converter as a whole, i.e., n bits. This is illustrated in FIGS. 7 and 8. FIG. 7 shows a segment of an input signal, wherein the input amplitude exceeds the design range of the converter, −1 to +1 V in this example, in the two regions near sample numbers 169-174 and 182-184.

FIG. 8 shows the quantization error for the same signal obtained by numerical simulation of the processing described in FIG. 1a. The simulation used the following values: n=10 bits, 40 MHz sampling, rms input signal level equivalent to 9 bits, and prediction filter $4z^{-1}-6z^{-2}+4z^{-3}-z^{-4}$. The quantization error in FIG. 8 is defined as the difference between the digital output of the predictive ADC minus the input signal and is expressed in least-significant-bits (LSBs) of the ADC. Where the input signal amplitude is within the input design range of the predictive ADC, the quantization error is no larger than ±½ LSB, as desired. Where the input signal exceeds the predictive ADC input range, the quantization error is larger than ±½ LSB (as it must), but it quickly drops when the input signal returns to within the predictive ADC input range, showing that the processing in FIG. 1a is stable even when the input signal amplitude exceeds the design range of the ADC.

For the vast majority of applications, an ADC is required to produce digital output samples at fixed intervals, i.e., the ADC sample clock period. Referring to FIG. 1a, it is desirable that error ADC 65 produce a digitized error sample at each period of the sample clock controlling sampler 25, so that there is a one-to-one correspondence between the sampled analog signal x[i] and the digitized output y[i] 60. It is also desirable that the m-bit ADC 35 operate at this same sample clock rate in the low power mode, since this minimizes the power consumption in the error ADC's low power mode. An additional n-bit conversion 37 is required, however, when the m-bit conversion overflows.

Figure 9:
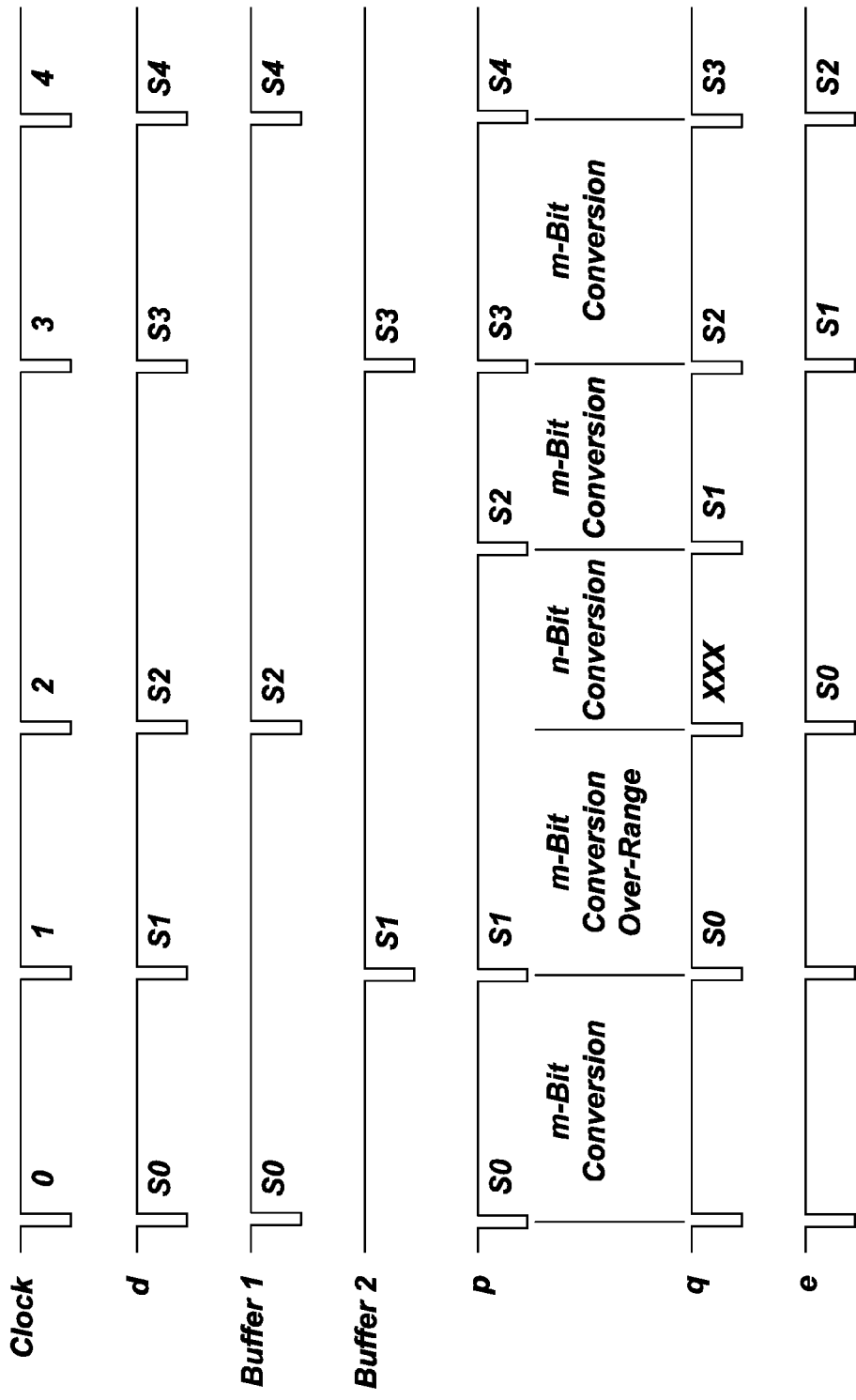
FIGS. 9 and 10 are timing diagrams illustrating the normal and over-range processing.
Figure 10:
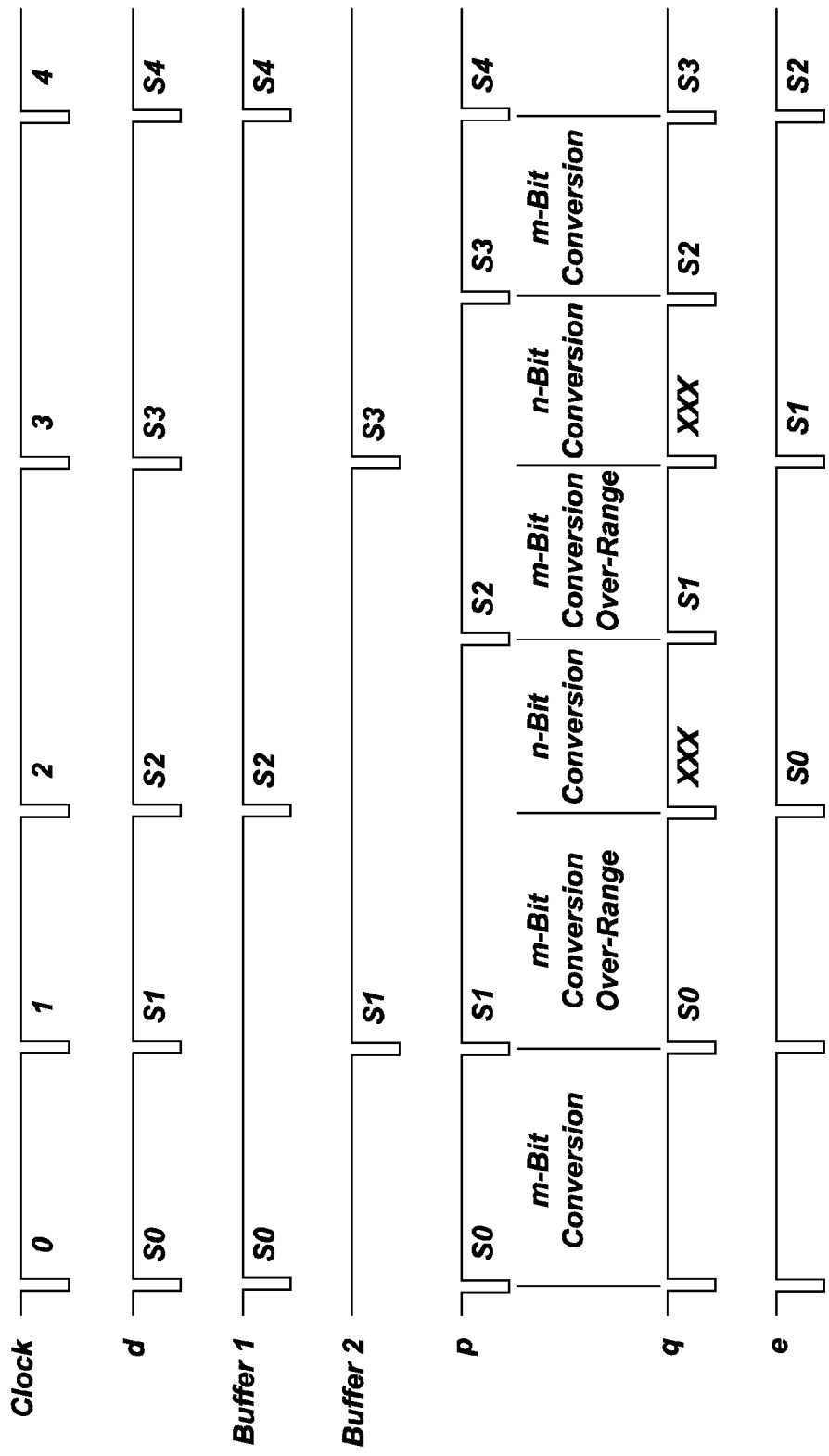
Figure 11:
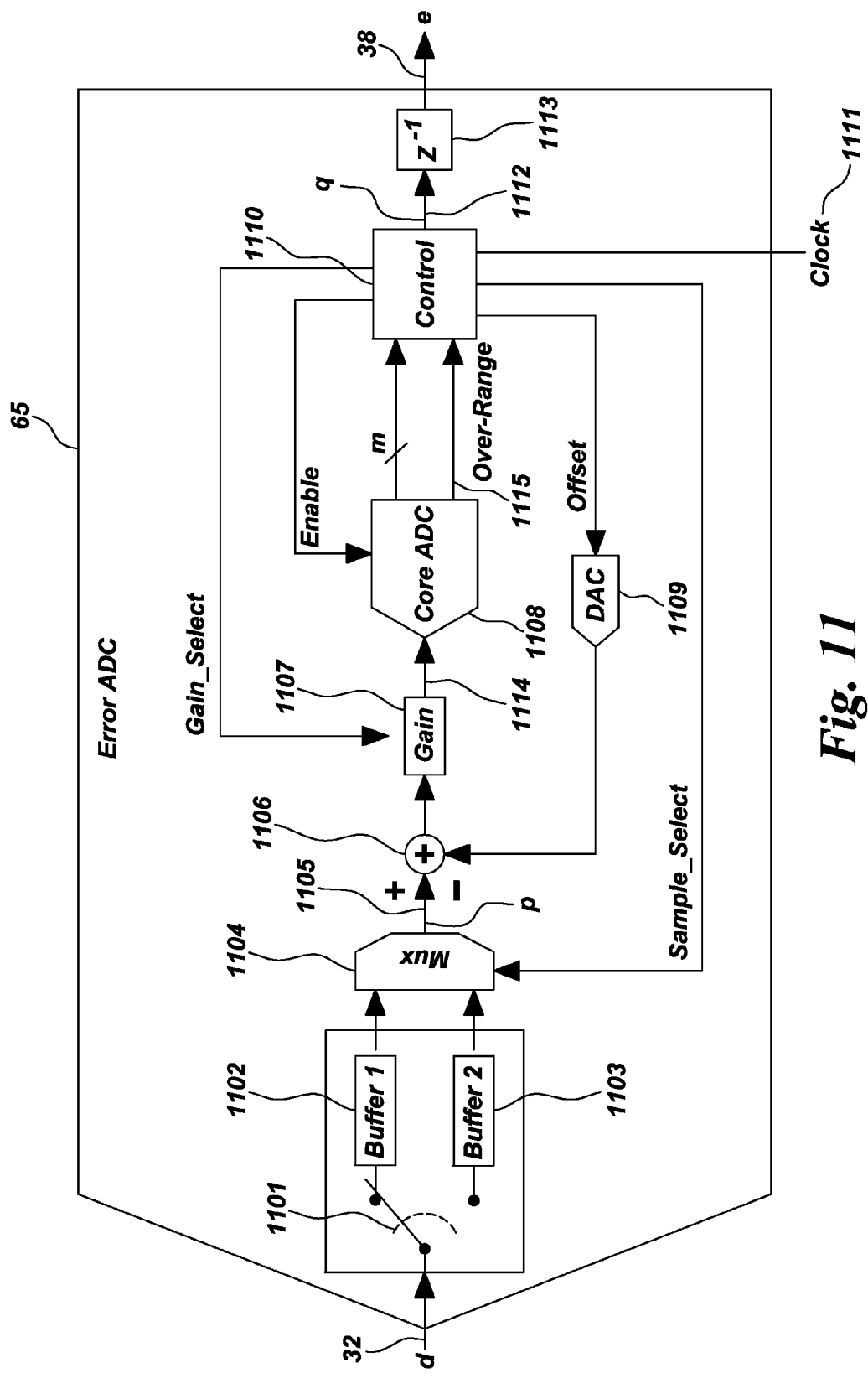
FIG. 11 shows the block diagram of the error ADC according to one embodiment.

FIGS. 9 and 10 are timing diagrams which explain how a continuous stream of output samples y[i] can be produced at the same sample clock rate controlling the input sampling x[i] and the m-bit ADC in the low-power mode while allowing n-bit processing in the overflow mode. The signal names in FIGS. 9 and 10 refer to the block diagram of the error ADC 65 from FIG. 1a as detailed in FIG. 11. FIG. 11 also describes an embodiment in which a single m-bit ADC, the "core ADC" 1108, which is a single ADC, is used as the m-bit ADC 35 in error ADC 65 and is used sequentially to function as the n-bit ADC 37 in error ADC 65 from FIG. 1a.

Referring to FIG. 9 and FIG. 11, these figures illustrate the case in which an isolated sample s1 is outside the m-bit range of the core ADC. The analog prediction error signal 32 from Figure 1a, synchronized to sample clock 1111, is double-buffered, with samples stored alternately in buffers Buffer1 1102 and Buffer2 1103 in conjunction with switching section 1101. The double buffering preserves each input sample for two clock periods. The analog sample to be converted, p, 1105, is extracted from one of the buffers as determined by the logic in the control block 1110 using multiplexer 1104.

In FIG. 11 at clock 0, sample s0 from Buffer1 1102 is placed on p. The output of the DAC 1109 is set to zero and the gain 1107 is set to unity by control block 1110 at this step in the processing so that the input 1114 to the core ADC 1108 is also p. An m-bit conversion of p is performed over clock period 0. By assumption the result lies within the m-bit range of core ADC 1108 and is placed on q 1112 as a digital value at the beginning of clock period 1. At the same time, the control logic 1110 connects Buffer2 1103 to p 1105, placing sample s1 on p. An m-bit conversion is performed over clock period 1, at the end of which s1 is found to lie outside the m-bit core ADC range.

In one implementation, the over-range signal 1115 is set if the core ADC outputs either its lowest digital code or its highest digital code. Since an n-bit conversion of s1 is required, control logic 1110 leaves value s1 on p at the beginning of clock period 2. A full n-bit conversion is performed using the first half of clock period 2 (the details of this conversion are described herein) and the result is written to q. On the second half of clock period 2, sample s2 from Buffer1 1102 is placed on p by the control logic 1110, and an m-bit conversion is performed. By assumption, this conversion lies within the m-bit range of core ADC 1108, so the result is written to q at the beginning of clock 3. Sample s3 from Buffer2 1103 is placed on p at the same time, and the process continues.

The output register 1113 reclocks q to synchronize the digital output e 38 with the sample clock boundaries, clock 1111. One can see that in this example that the three output samples s0, s1 and s2 produced at the output of the error ADC, e, appear on consecutive sample clocks even though the conversion times internal to the error ADC differed.

FIG. 9 illustrates the case in which the m-bit conversion of s2 does not over-range. FIG. 10 shows the timing when this conversion does over-range and requires a full n-bit conversion. The first half of the next clock period, clock 3, is used for the full n-bit conversion of s2, and an m-bit conversion of s3 is performed in the second half. If the m-bit conversion of s3 does not over-range (as shown), the process continues as at clock 0. If the m-bit conversion of s3 does over-range (not shown), the process continues as at clock 2, with a full n-bit conversion of s3 in the first half period of the next clock and an m-bit conversion of s4 in the second half. In either case, samples are produced uniformly in time at the output of the error ADC, e.

The low-power m-bit and the full n-bit conversions could be performed using separate ADCs. The implementation shown in FIG. 11 reuses the m-bit ADC 1108, to also perform the full n-bit conversion.

Figure 12:
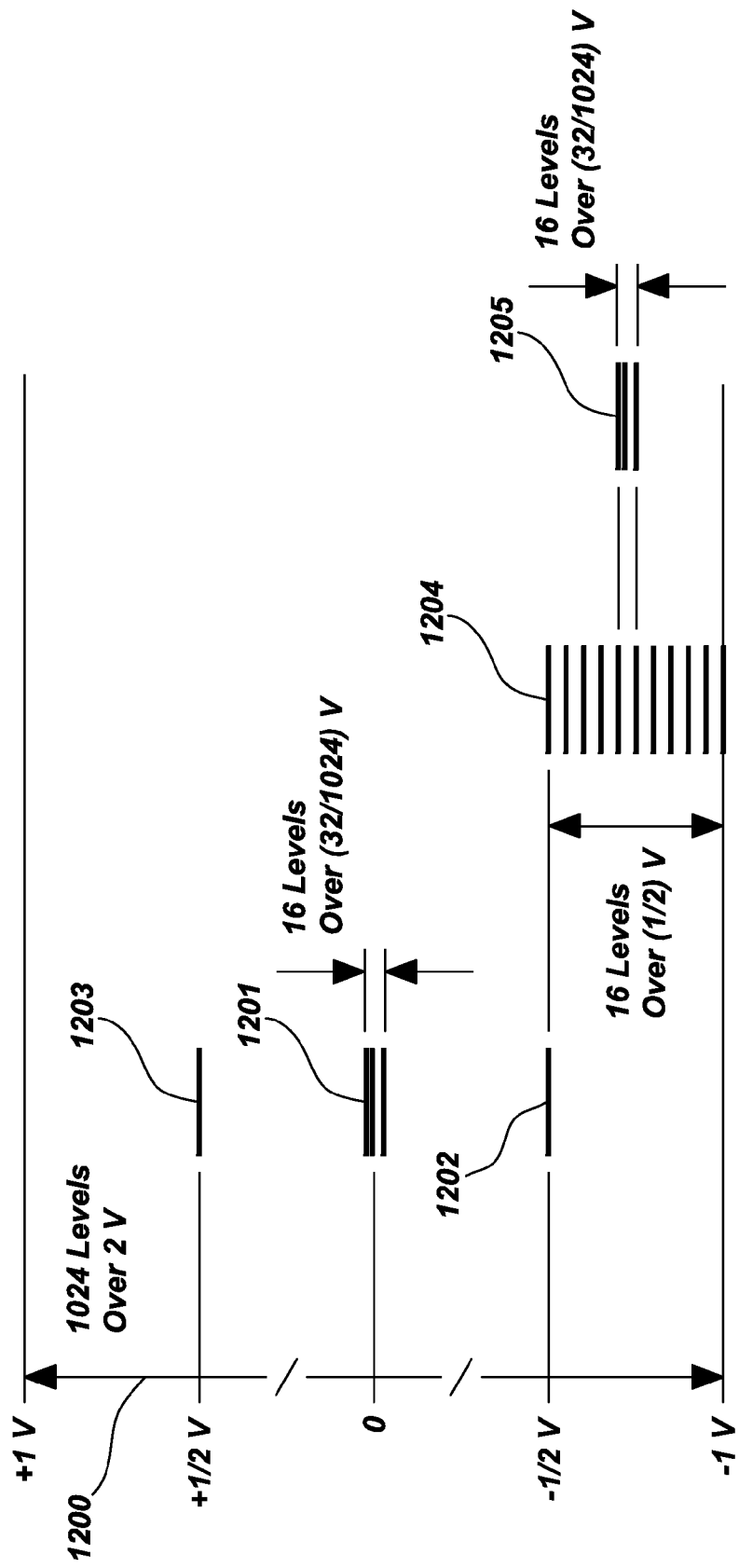
FIG. 12 explains conceptually how the core ADC can be used multiple times to produce the full bitwidth output of the error ADC in accordance with one embodiment.

FIG. 12 shows conceptually how the core ADC can be used multiple times to produce the full bitwidth output of the error ADC. For definiteness, FIG. 12 illustrates an example of the case n=10 and m=4. The n=10 output bits define 1024 voltage levels 1200 which are assumed to correspond to an input voltage range of −1 V to +1 V. Thus an LSB at the output corresponds to a voltage difference $2/2^{10}$ V at the input. The m=4 bit core ADC defines 16 voltage levels 1201 centered around 0 V, spaced by the same LSB. When implemented as a flash ADC, these 16 levels are defined by 16 voltage comparators. In one example, two extra voltage comparators are added, one with a transition at −½ V 1202 and one with a transition at +½ V 1203. If the prediction error signal lies within the four-bit range of the core ADC, the output of the error ADC is just the corresponding four-bit digital code.

If the prediction error signal lies outside the nominal four-bit range, the outputs of the two extra comparators are used to determine in which of the four voltage ranges, [−1, −½], [−½, 0], [0, ½] or [½, 1], the prediction error signal lies. This determines the two most significant bits of the desired 10-bit result. Two stages of a subranging ADC architecture, using the four-bit core ADC at each stage, determine the remaining eight bits. The 16 levels of the core ADC are mapped to the correct sub-range. In FIG. 12, this is indicated by the 16 levels 1204 remapped to span the voltage range [−1, −½]. The digital output, after scaling, gives four more bits in the result. It also determines a new sub-range containing the input voltage value. The 16 levels of the core ADC are mapped to this new sub-range, as shown at 1205 in FIG. 12; the digital output, after scaling, gives four more bits in the result. This process produces a result with 2+4+4=10 bits over the voltage range [−1, +1] V.

The configuration described by FIG. 12 is labeled as "(4+)-bit/4-bit subranging," where "(4+)-bit" describes the $2^4+2$ comparators used at the first step described above, and "4-bit" describes the $2^4$ comparators used at the second and third steps.

Rather than adjusting the input range of the core ADC at each step, one example leaves the input voltage range of the core ADC fixed and shifts and scales the input signal to compensate. Referring to FIG. 11, the DAC 1109 and summer block 1106 provide the shift and the gain block 1107 provides the scaling under control of control logic 1110. The DAC 50 in FIG. 1a can be reused here as DAC 1109 to reduce the circuit size.

The values n=10, m=4 are chosen for illustration only. Many other combinations can be constructed using the same method with minor changes. For example, an n=10 bit converter can be constructed using an m=3 bit core ADC. No extra comparators are required in this case. The comparator at V=0 in the core ADC divides the input range into two regions, supplying one bit. Three stages of three bits each provide nine more bits for a total of ten bits, as desired, wherein this configuration is termed "3-bit/3-bit subranging." A "4-bit/3-bit subranging" implementation is also within the scope of the system.

Power Analysis

Figure 13:
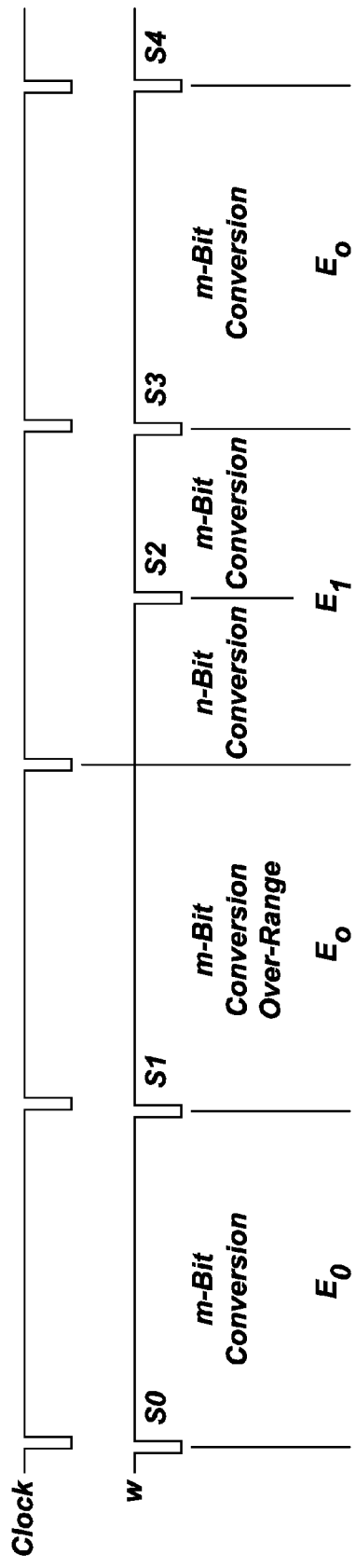
FIGS. 13 and 14 show that the energy consumed by the converter during a sample clock period takes on two possible values in this example.
Figure 14:
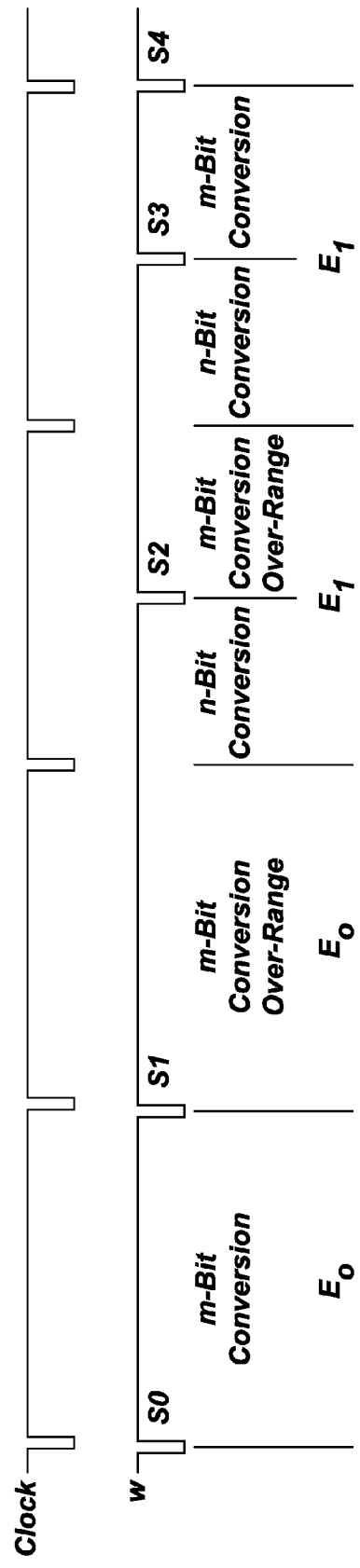

The power consumed by the predictive ADC depends upon the power consumption of the error ADC in its low-power m-bit and over-range full-bitwidth modes, as well as how often each mode is used. Referring to FIGS. 13 and 14, the energy consumed by the converter during a clock period takes on two possible values: $E_0$, the energy consumed by an m-bit conversion in one period; and $E_1$, the energy consumed by an n-bit conversion in one-half period plus the energy consumed by an m-bit conversion in one-half period. FIGS. 13 and 14 show that $E_0$ is consumed for each in-range input sample and $E_1$ is consumed for each over-range sample. The total energy required to convert an input signal is thus $E=(N-N_1)E_0+N_1E_1$, where N is the total number of samples and $N_1$ is the number of over-range samples. The energy consumed per output sample is E/N. The power P consumed is (E/N)·f where f is the sample clock frequency, so that:

$$P=[(1-\delta)E_0+\delta E_1]f,  \qquad \text{Eq. 1}$$

where $\delta=N_1/N$ is the fraction of over-range samples, which shall be referred to as the over-range rate.

$E_0$ and $E_1$ can be estimated as follows: The energy consumed during the conversion of one sample is i·V·T, where i is the converter current, V is the converter total supply voltage, and T is the time required for the conversion. The converter current will be approximately proportional to the number of comparators in the ADC, $N_c$. The current will also increase approximately linearly with the inverse of the conversion time T, since faster settling times require larger drive currents. Thus the energy consumed per conversion is approximately proportional to $(N_c/T)\cdot T\cdot V=N_c\cdot V$. It is assumed that the supply voltage is constant, and for this illustration will be set to the nominal value 1.

For the (4+)-bit/4-bit subranging architecture shown in FIG. 12, $E_0=18$, since (16+2) comparisons are made. The calculation of $E_1$ is a bit more involved. The 10-bit conversion in the first half-period requires two 4-bit conversions, or 2×16=32 comparisons. The second half-period requires 18 comparisons. For this example, $E_1=50$. A similar analysis can be performed for the 3-bit/3-bit subranging configuration and the 4-bit/3-bit subranging case. The results are summarized in FIG. 15.

For comparison, the power consumption of a conventional, non-predictive ADC can be estimated using the same model. The naive implementation of a 10-bit ADC using $2^{10}$ comparators gives $E_0=1024$. However, this vastly overestimates the power required to implement a 10-bit ADC. A more realistic comparison is a pure subranging architecture. Pure subranging means using an m-bit subranging converter on every clock, without prediction. By way of example, the 3-bit subranging converter requires one extra comparator, and the 4-bit subranging converter requires three extra comparators. The results for power consumption are summarized in FIG. 16.

Figure 17:
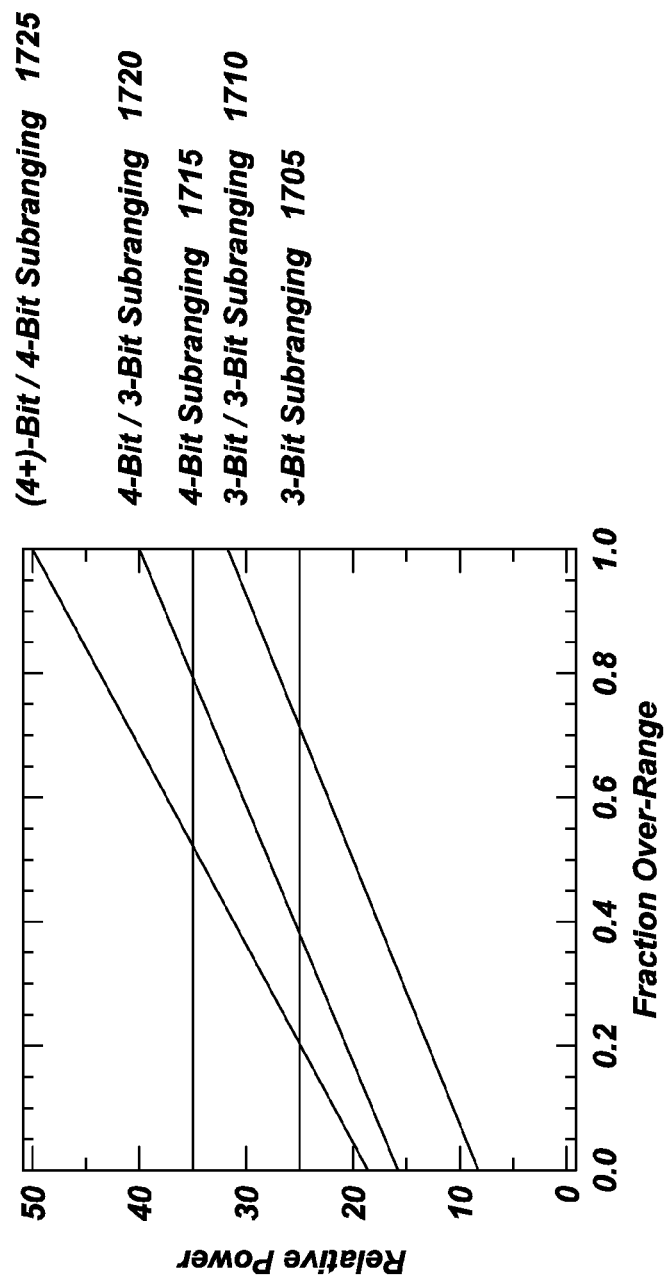
FIG. 17 shows the relative power consumption for these various configurations as a function of the over-range rate for fixed sampling frequency.

FIG. 17 shows the power consumption for various configurations as a function of the over-range rate for fixed sampling frequency. The configurations include 3-bit subranging 1705, 3-bit/3-bit subranging 1710, 4 bit subranging 1715, 4-bit/3-bit subranging 1720 and (4+)-bit/4-bit subranging 1725. At sufficiently low over-range rates, all of the predictive ADC architectures 1710, 1720 and 1725, consume less power (in this approximate model) than the non-predictive, subranging architectures 1705 and 1715.

Figure 18:
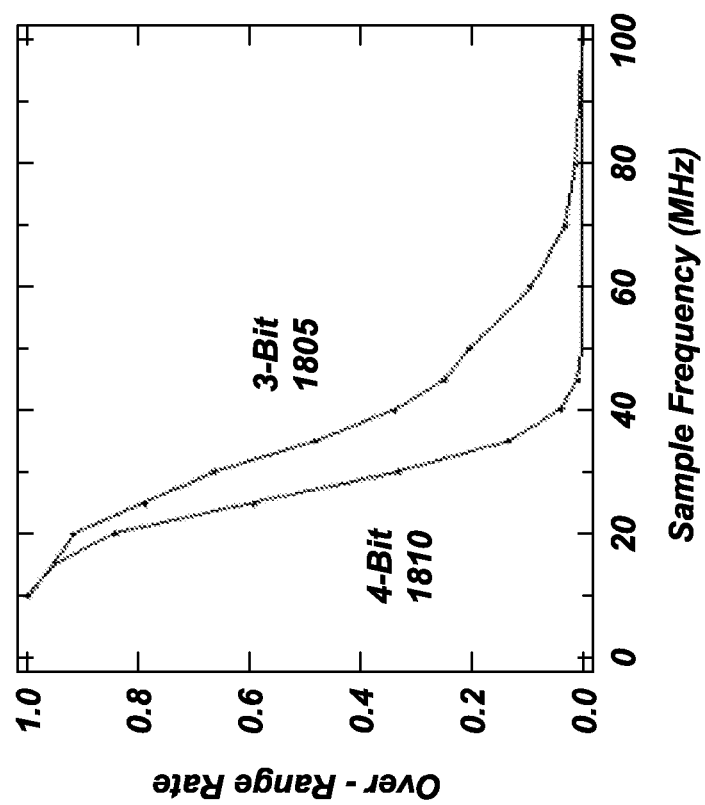
FIG. 18 shows the over-range rate for 3- and 4-bits as a function of sampling frequency for an example case.

FIG. 18 shows the over-range rate for m=3 bits 1805 and m=4 bits 1810 as a function of frequency for an example case. The input signal included white noise with an rms value equivalent to 4 LSBs added. The signal was scaled so that its rms value was equivalent to 8 bits. A three-pole, lowpass analog filter was used. At each frequency, the number of integer weights in the prediction filter was chosen to minimize the over-range rate. The prediction filter performance tends to improve, decreasing the over-range rate, as the sampling frequency improves since the input signal bandwidth (ignoring the noise component) is constant. This may be more obvious if one imagines the filter response as a function of the frequency normalized to the Nyquist sampling rate; the filter response is then constant, while the upper edge of the signal band will be pushed toward zero on the normalized frequency axis.

Figure 16:
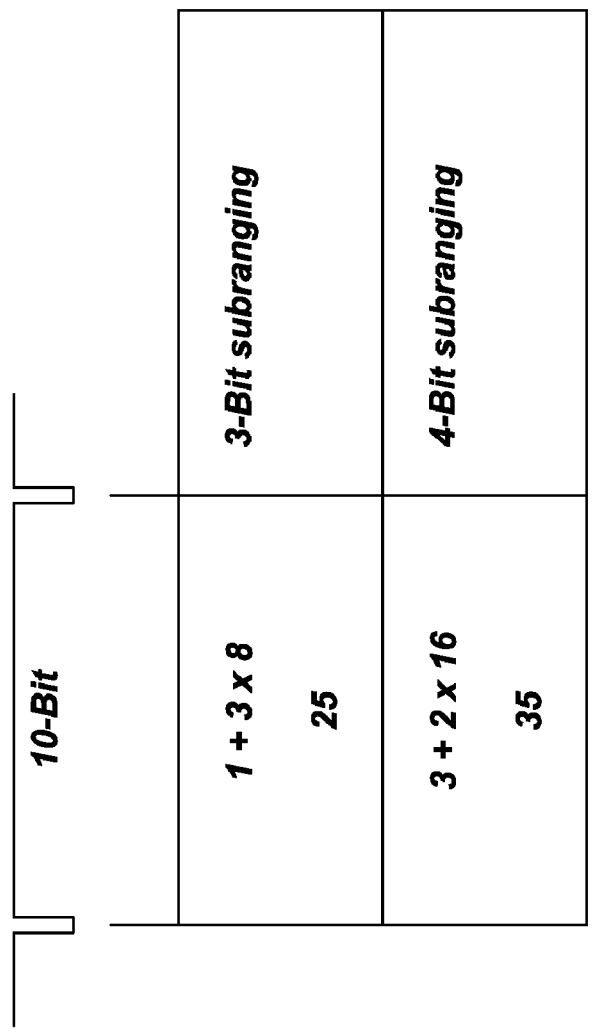
FIG. 16 shows the relative energy consumed during a sample clock period for two non-predictive ADC configurations.
Figure 19:
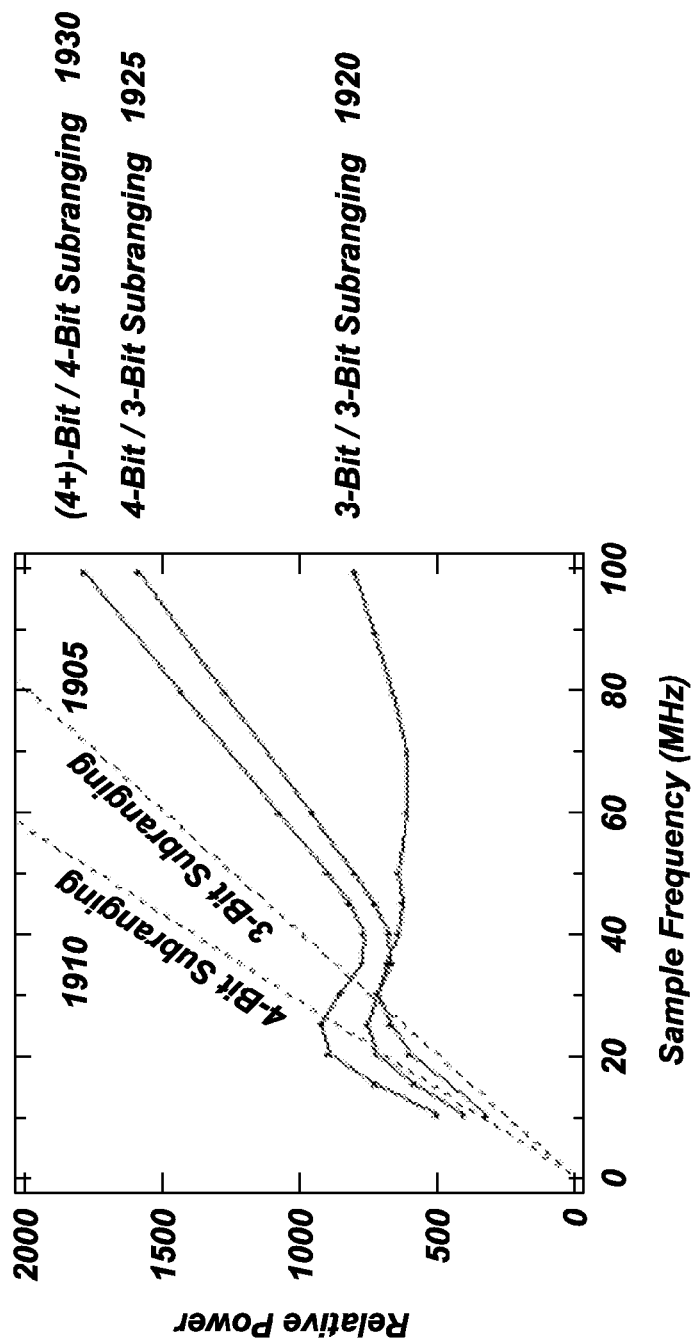
FIG. 19 shows the relative power consumption, using the over-range rate from FIG. 18 and the energy consumption values from FIGS. 15 and 16.

FIG. 19 shows the power consumption estimated using Eq. 1 for the over-range rate from FIG. 18 and the energy consumption values from FIGS. 15 and 16. The dotted lines are for the non-predictive architectures for the 3-bit subranging 1905 and the 4-bit subranging 1910 configurations and the solid lines are for the predictive architectures for the 3-bit/3-bit subranging 1920, 4-bit/3-bit subranging 1925 and the (4+)-bit/4-bit subranging 1930 configurations. The general trend of increasing power with increasing frequency is due to the multiplicative factor of the sampling frequency in Eq. 1.

At low sampling frequencies, the over-range rate approaches one, so the low-frequency slopes of the power curves for the predictive architectures (solid lines in FIG. 19) are proportional to the values in the second column in FIG. 15. At high sampling frequencies, the over-range rate approaches zero, so the high-frequency slopes are proportional to the values in the first column. The competition between these two asymptotic slopes gives a minimum in the power curves (albeit quite shallow for the 3-bit/3-bit subranging case 1920). For the non-predictive cases 1905, 1910, the slopes are proportional to the constants in FIG. 16. For this example, the prediction system reduces the power consumption for sampling rates above about 20 MHz.

Unlike conventional ADCs, the power consumption of this system depends upon the spectrum of the input signal. The power consumption increases with increasing noise level, but not excessively, near the design point for the prediction filter, which in one example, is zero bits, since the number of taps in the prediction filter was optimized assuming no noise.

The power model used herein is only an approximation used to illustrate the general features of the invention. Power estimates from more sophisticated modeling using actual circuit components can be used to provide more accurate estimates to optimize the design for a particular application. Other considerations, such as the complexity of the control circuitry or the speed of the circuitry required may influence this optimization. FIG. 19, for example, suggests that the 3-bit/3-bit subranging predictive architecture has the lowest power consumption for the conditions which were simulated. However, the m=3 bit core ADC in this architecture would have to operate at a higher clock rate than would an m=4 bit core ADC used in the (4+)-bit/4-bit subranging predictive architecture, and this higher clock rate might be impractical using present technology to implement for a converter designed to operate at high sampling frequencies.

Circuit Implementation

As detailed herein, depending on the accuracy of the prediction and the statistics of the distribution of the input signal, it is possible to use a low bit-width converter to digitize the residual or error signal. Since the power consumed by an ADC is directly related to the number of bits in the conversion, the system realizes significant power savings while still maintaining the full-scale performance of a much larger bit-width ADC. This part of the system achieves power reduction on the order of two to three times that of current state of the art converters.

In order to further improve on the power and area savings of the data converter, the system further utilizes programmable analog memory and voltage storage devices such as capacitors and batteries. In one example, Floating Gate (FG) capacitors and trimming technology are used for correction of inherent offsets in the circuits themselves. Use of programmable analog memory achieves additional power reduction at least two to three times that of current state of the art converters by allowing for low current operation with equivalent precision.

Therefore the complete system can achieve power efficiency approaching an order of magnitude better than that of current state of the art converters.

Referring again to FIG. 1a, that shows a block diagram of one embodiment of the system with three main blocks: A digital prediction filter providing a high-resolution digital prediction for the next signal sample; a high resolution, fast settling DAC providing an equivalent analog value of the predicted next signal sample; and a low resolution, high speed ADC representing the error between the predicted value and the input signal accurate to a reduced number of bits.

Data is sampled at the input and the difference between the predicted value and the actual value is measured by the high speed ADC. This digitized error term is then added to the digital actual predicted digital value and forms the corrected output of the device. The corrected output is then fed back into the prediction block as part of the historical data used to generate the next prediction.

In an alternate embodiment, an analog processing function may be used to generate the predicted output using analog samples of the input and, for example, current mode processing circuitry.

Due to the nature of the prediction filter, it is helpful to provide an analog low pass filter ahead of the sampling operation as shown. This same block can further incorporate the required preamplifier and Time Gain Control (TGC) amplifiers that are used in a typical ultrasound system.

Figure 20:
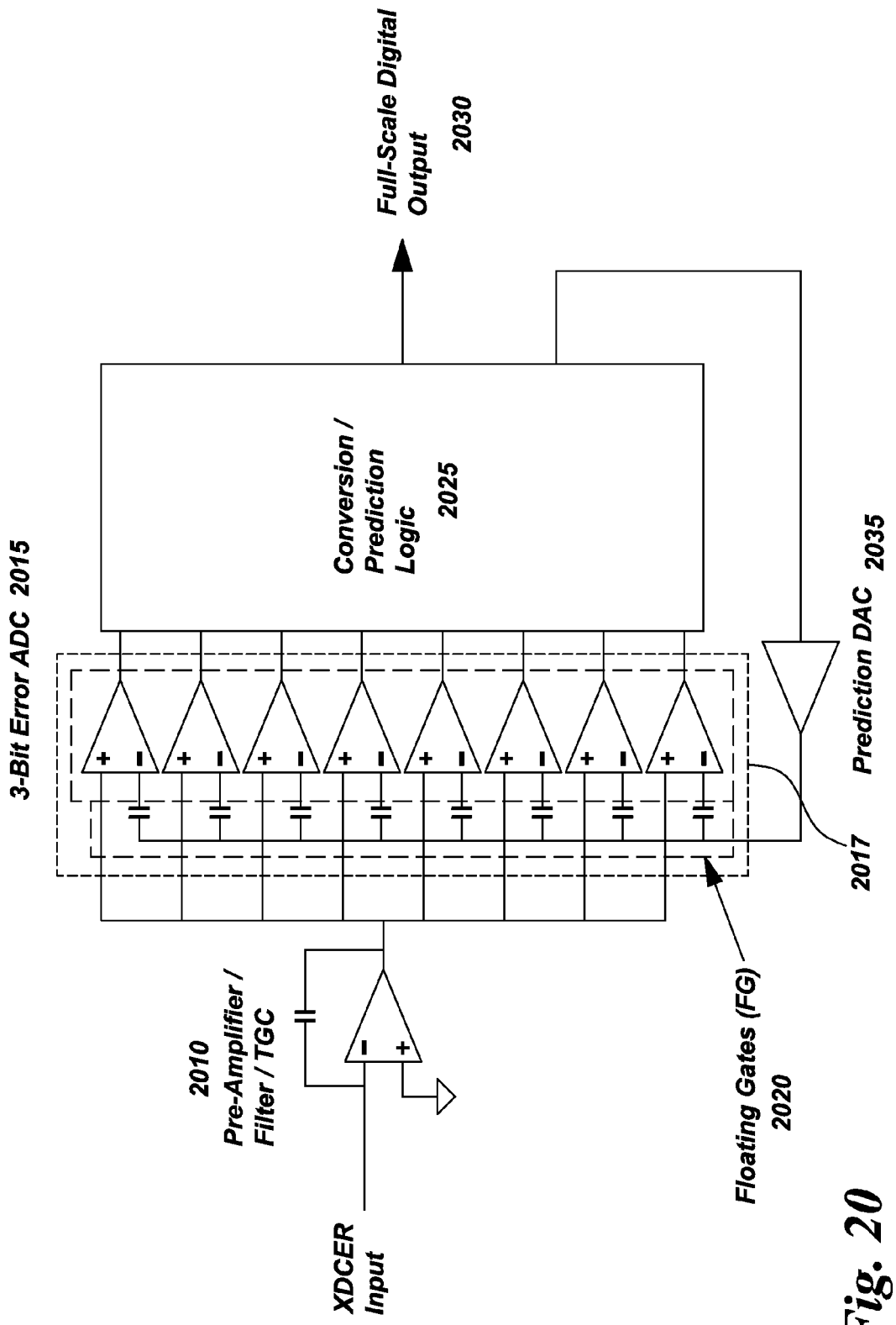
FIG. 20 illustrates a system embodiment including a flash converter according to one embodiment.

While the Error ADC can be implemented in any of the available converter architectures (including SAR, Delta-Sigma, Flash or Subranging ADC), a straight-forward implementation results from a Flash converter such as shown in FIG. 20. In this example, a 3 bit Flash is shown composed of a bank of 8 comparators which determine the exact location of the error signal within a given conversion window.

In more particular detail of one embodiment, the analog input signal such as the transducer input is coupled to a pre-amplifier/filter/TGC section 2010 that feeds the 3-bit error ADC 2015. The ADC 2015 includes a bank of comparators 2017 and a bank of capacitors 2020, such as floating gate capacitors. Each of the comparators 2017 of the 3-bit error ADC 2015 includes a floating gate 2020 used for trim and fine conversion steps. In one embodiment the ADC 2015 can be used to replace the first summer 30 of FIG. 1a.

The 3-bit error ADC 2015 is the input to a conversion/prediction logic section 2025. The output of the conversion/prediction logic section 2025 is the n-bit or full-scale digital output 2030. A part of the feedback, the output signal 2030 is also fed into a prediction DAC 2035 that is then fed into the 3-bit error ADC 2015.

According to one example, the reference point for the conversion is set using the digital-to-analog converter with full-scale precision for the conversion output (e.g. 12-bits). The comparator trip points can be set using voltage levels that are stored locally on programmable analog memory devices 2020 such as FG capacitors. These levels may also be set using a resistor ladder. The programmable analog memory devices 2020 can also store calibration voltages that are measured during a calibration procedure and used to zero out any offsets that exist in the comparators of the 3-bit error ADC 2015. The programmable analog memory devices 2020 can be programmed either once during manufacturing, on power-up of the system, or whenever calibration is requested by the operator. In this way, a single programmable analog memory devices can be used to store both the offset trim calibration and the comparator trip points for an efficient implementation.

Mismatch between the gain and offset of the transfer functions through the ADC and the DAC can cause errors in the outputs. These errors can be mitigated according to one example by a closed loop calibration operation in which a test signal is fed to the DAC and is converted by the ADC. The memory programming values can then be adjusted to reduce the closed loop errors in gain and offset to zero.

The differencing operation that is shown in FIG. 1a can be accomplished in the architecture in FIG. 20 by feeding the digital prediction to the prediction DAC 2035, generating a representative analog reference voltage, adding this reference voltage to the voltage trip points that are stored on the programmable analog memory devices 2020 and then comparing these respective voltages on each of the eight comparators 2017 of the 3-bit error ADC 2015 relative to the input signal. The resulting thermometer code is then encoded and used to provide the error signal for the next predictive sample output.

The prediction logic section 2025 in this example implements a simple prediction filter operation in order to generate a prediction or guess for the next sample in time. Using an optimization procedure, it is possible to generate digital filters that take simple integer coefficients in their implementation. Representative filter kernels include [1, −3, 3] and [4, −6, 4, −1]. These kernels are easily implemented with minimal logic since they can be decomposed into shift operations and additions. Therefore a floating-point or fixed-point multiplier may not be needed to implement these filters. This feature leads to significant savings in power and area consumption of the logic part of the circuit and is a further feature of the system.

Implementation of the prediction filter in one aspect can therefore be accomplished using a series of delay registers that hold successive values of the digitized corrected output. These delay registers are then fed into scaling operations and then summed to yield the predicted output.

In an alternative embodiment the programmable gain amplifier implements the first analog summation function by feeding the analog prediction signal directly to the reference input of the amplifier. In this case a single bank of analog memory devices is used to set the trim and reference for the A/D converter comparators and their common terminals are connected to a ground reference.

In a further enhancement to this embodiment, the programmable gain settings of the programmable gain amplifier are controlled during the over-range case in such a way as to implement multiple conversion windows. This further enhancement has the feature of reducing the number of capacitors used since there is not a need for a second and third bank of capacitors at the inputs to the A/D converter comparators.

Figure 21:
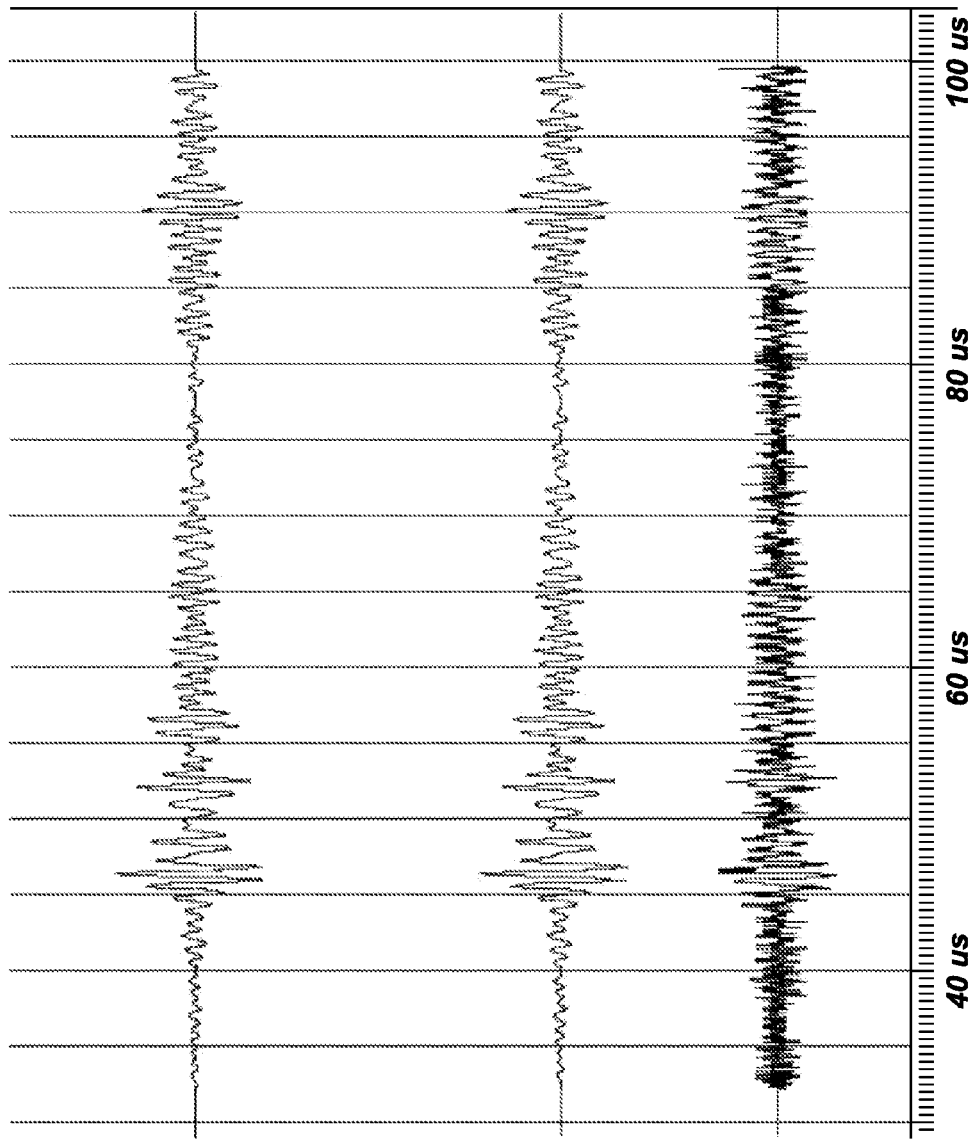
FIG. 21 are simulation results for the prediction filter using a series of delay registers where the error signal is relatively well-behaved and falls within the full 3-bit range of the Error ADC.

Representative simulation results are shown in FIG. 21, illustrating the input signal 2110, the prediction signal 2115 and the error signal 2120. As shown, the error signal is relatively well-behaved and falls within the full 3-bit range of the Error ADC. While the predictive ADC is fairly accurate, there are instances (particularly on startup and when the signal is changing rapidly) when the error signal 2120 falls outside the range of the Error ADC. In these cases, the converter will fail to produce the correct output. And because the corrected outputs feed directly back into the prediction circuitry, future predictions will eventually fail as well.

In these cases, the converter begins to become unstable. The error signal eventually begins to saturate at positive and negative values, and the predicted output then begins to oscillate. This behavior is known as a limit-cycle oscillation and is known in A/D converter literature specifically as relates to Delta-Sigma ADC's.

In order to recover from this anomalous over-range behavior, one embodiment employs a predictive converter with an additional over-range recovery circuit. The over-range recovery circuit consists of an additional full-range ADC which is only operated in the rare cases where over-ranging occurs.

One embodiment of this system is based on the realization that, while the power required for a full-scale converter to operate continuously at the system sample rate may be high, the predictive converter as a whole need not consume excessive power since the recovery circuit is only used infrequently and for a short period of time. Therefore, since the Error ADC is small and power efficient and operates the majority of the time, the overall power consumption is largely small.

A further feature that is intended to reduce area consumption can be realized by combining the Error ADC with the over-range recovery circuit. This can be done by using the Error ADC as the component ADC in a sub-ranging architecture. In one example a 4-bit Flash Error ADC is made by changing the conversion window in a series of subranging A/D conversion steps.

Referring again to FIG. 11 that shows a complete circuit realization incorporating the Error ADC (now called the "core ADC") into a dual structure that operates both in the standard prediction mode and in the over-range recovery mode. In one case, changes in the conversion window are accomplished using a programmable gain stage ahead of the converter. A further embodiment performs the gain function ahead of the differencing operation and uses the time-gain compensation (TGC) amplifier for this purpose instead of a dedicated additional gain stage. TGC amplifiers are used, for example, in ultrasound applications and provide amplification of low gain returning sound waves that come through deep structures, so that there is an even image density through the field.

Figure 22:
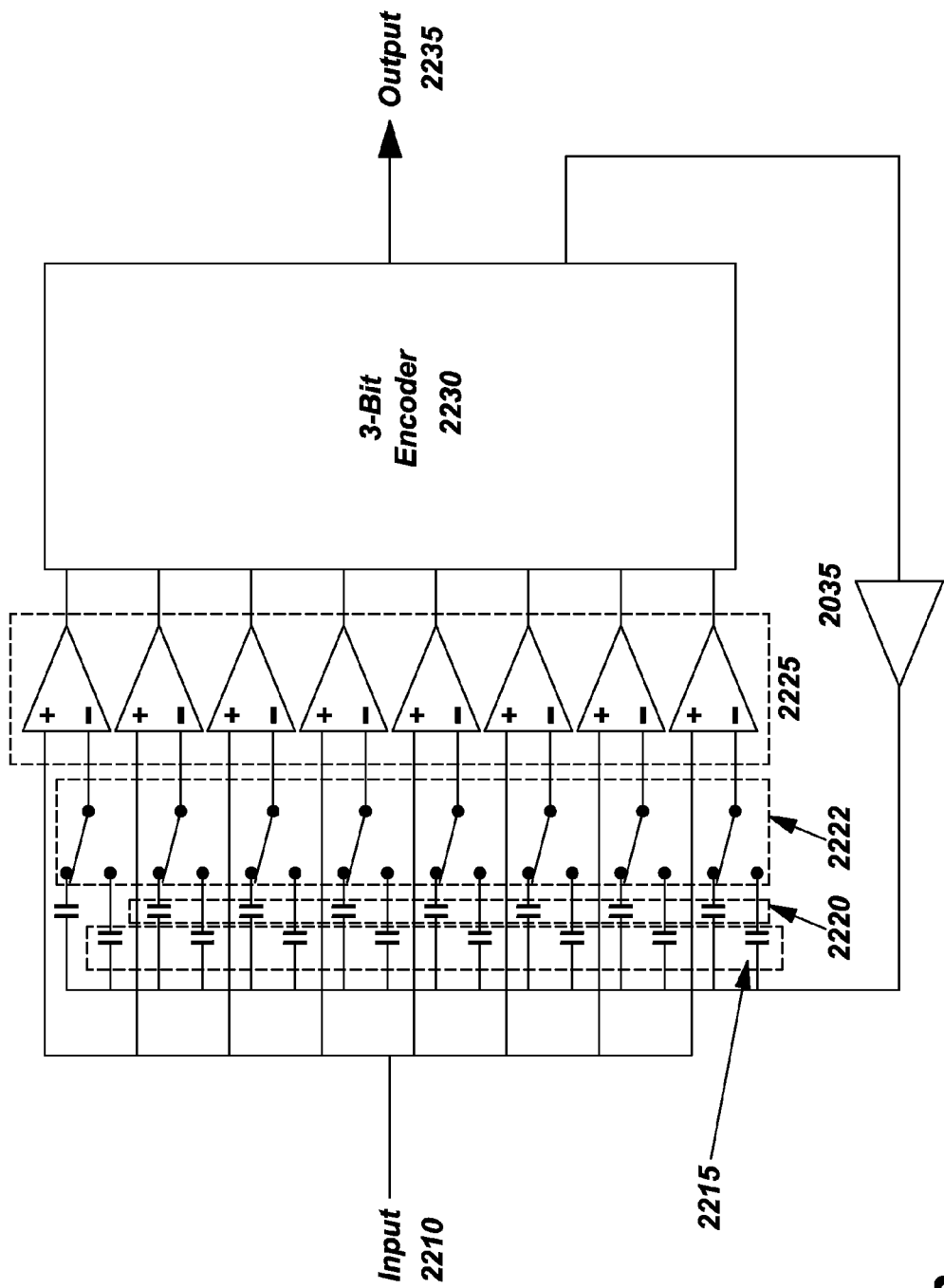
FIG. 22 illustrates a further improvement combining the Error ADC with the over-range recovery circuit.

It is also possible to change the conversion window on the fly, for example, by reprogramming the programmable analog memory devices that set the bias points for the conversion levels. One practical way to implement this function is shown in FIG. 22. In this example, two banks of capacitors 2215, 2220 are used, such as FG capacitors or standard capacitors, with the first bank 2215 maintaining the conversion window for one state of the ADC, while the second bank 2220 holds the reference levels for a different state. The input signal 2210 is one input to the comparators in the bank of comparators 2225 with the other comparator input coupled to a switching section 222 that engages the signal from one of the capacitor banks 2215, 2220. The comparator output is fed to the encode 2203 which provides the full bitwidth output. The two banks of capacitors 2215, 2220 are switchably coupled by a switching section 2222 to enable coupling to the bank of comparators 2225. For example, the first bank of capacitors 2215 can represent the coarse window reference while the second bank of capacitors 2220 represents a fine window reference.

It is also possible to change the conversion window on the fly, for example, by reprogramming the programmable analog memory devices that set the bias points for the conversion levels. One practical way to implement this function is shown in FIG. 22. In this example, two banks of capacitors 2215, 2220 are used, such as FG capacitors or standard capacitors, with the first bank 2215 maintaining the conversion window for one state of the ADC, while the second bank 2220 holds the reference levels for a different state. The input signal 2210 is one input to the comparators in the bank of comparators 2225 with the other comparator input coupled to a switching section 2222 that engages the signal from one of the capacitor banks 2215, 2220. The comparator output is fed to the encode 2203 which provides the full bitwidth output. The two banks of capacitors 2215, 2220 are switchably coupled by a switching section 2222 to enable coupling to the bank of comparators 2225. For example, the first bank of capacitors 2215 can represent the coarse window reference while the second bank of capacitors 2220 represents a fine window reference.

Figure 23:
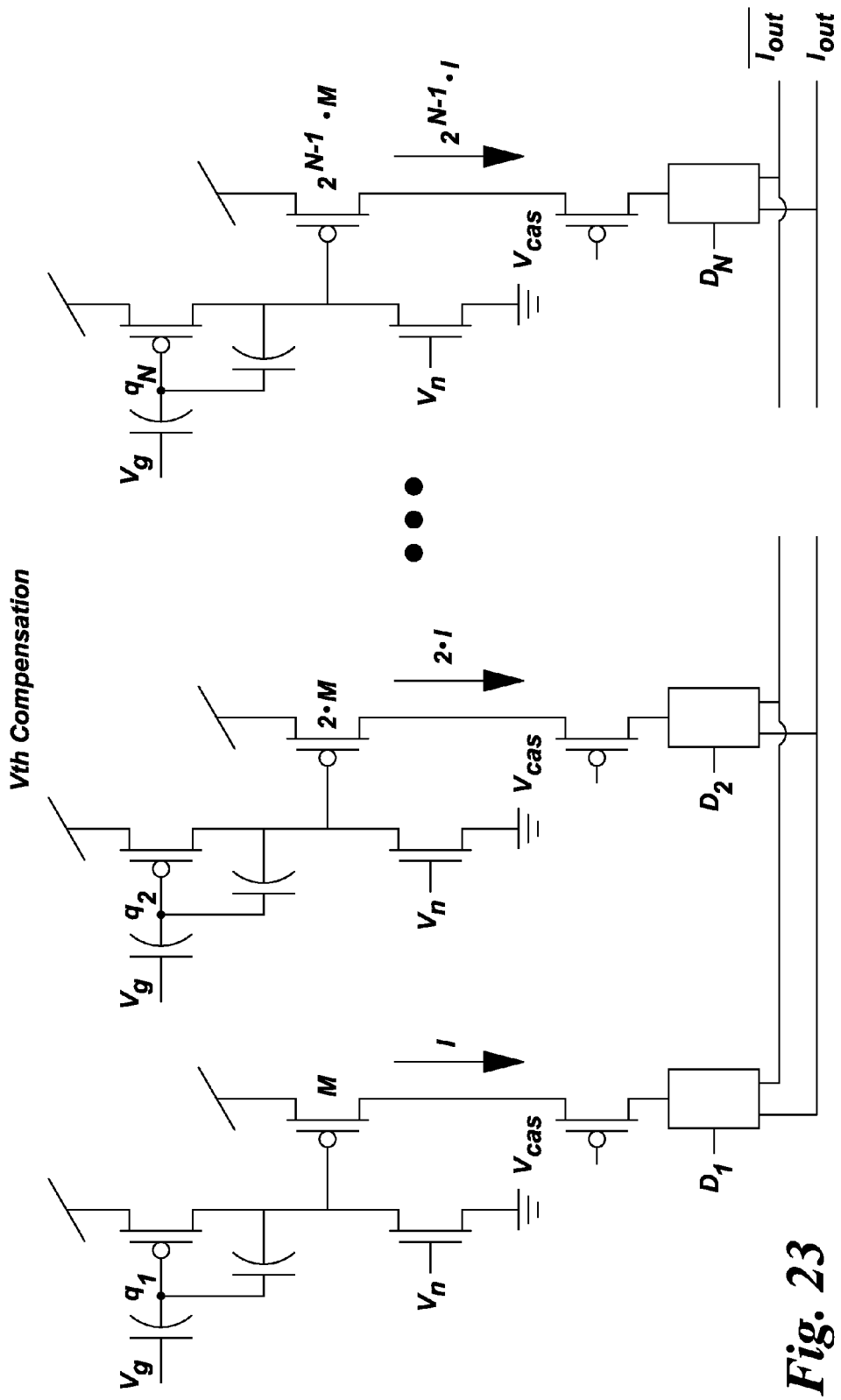
FIG. 23 shows a typical implementation of a floating gate based trim implementations for DACs.

As discussed herein, the main analog blocks in the converter are the core or Error ADC and the DAC. These devices can be calibrated using FG capacitors in order to realize very precise components in minimal area and with power efficient operation. Floating gate based trim implementations for DACs is known in the art and a typical implementation is shown in FIG. 23. Typically, the errors in such DACs are a function of the current itself, wherein smaller currents result in larger errors due to mismatch as a result of the exponential relationship between current and voltage in the sub-threshold region. Typically the currents in each current source are trimmed (transistors labeled M, 2M . . . ) by adding a correcting floating gate charge (q1, q2 . . . qN) to achieve the required resolution at lower operating currents.

Figure 24:
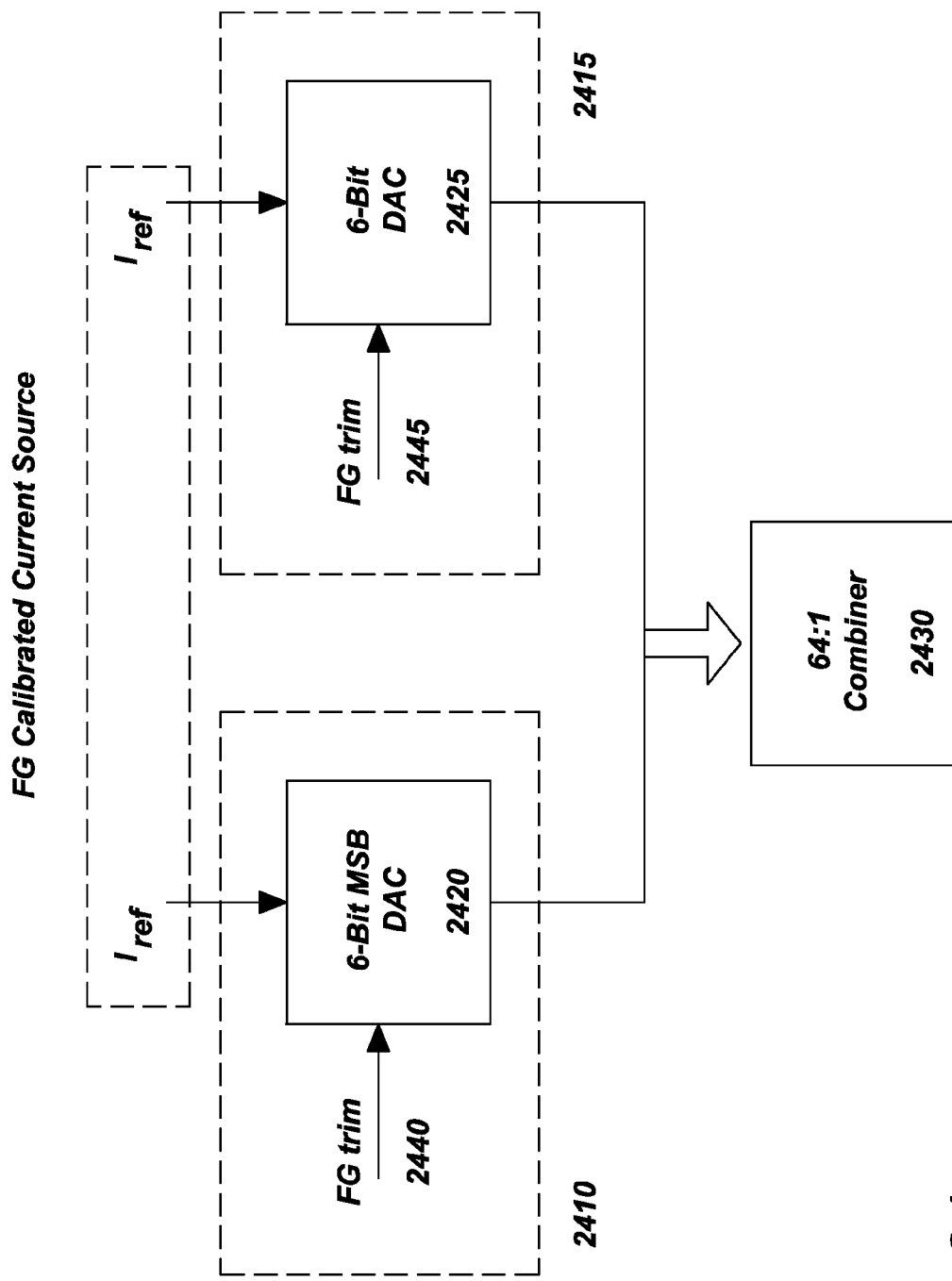
FIG. 24 illustrates segmenting a DAC into multiple blocks according to one embodiment.

Referring to FIG. 24, further savings in power and area can be realized by segmenting the DAC into multiple blocks 2410, 2415, correcting each block separately and then combining these currents and applying a correction to the combining block 2430 that further minimizes area. For example, a 12-bit converter would typically use $2^{12}$=4096 unit current sources. By segmenting it into two blocks 2410, 2415 wherein each block comprises respective 6-bit current sources 2420, 2425, thereby having $2 \times 2^6$+one $2^6$=192 unit sources are used, offering significant area reduction. Further, each of these blocks 2410, 2415 have a smaller error spread amongst themselves, thus resulting in easier implementation of correction algorithms and mitigating risks due to floating gate charge leakage. Each of the segments 2410, 2415 can be combined in a combiner 2430 such as a 64:1 combiner. The blocks 2410, 2415 may further contain subblocks having a further breakdown into smaller sized current sources.

Furthermore, each of the segments 2410, 2415 can be trimmed individually by respective FG trim 2440, 2445. The respective FG trim algorithms and the exact segmentation can be optimized for power, area and ease of implementation for each ADC based on the choice of fabrication process. The 2-segment, 6-bit approach was chosen here for ease of implementation however the principles are extendible to other designs. Other designs such as 3-segment, 4-bit DACs may be used as well however these may not completely take advantage of the inherent matching performance of the current sources and may result in larger spikes in the combiners since a larger range would be covered by the combination block.

Figure 25:
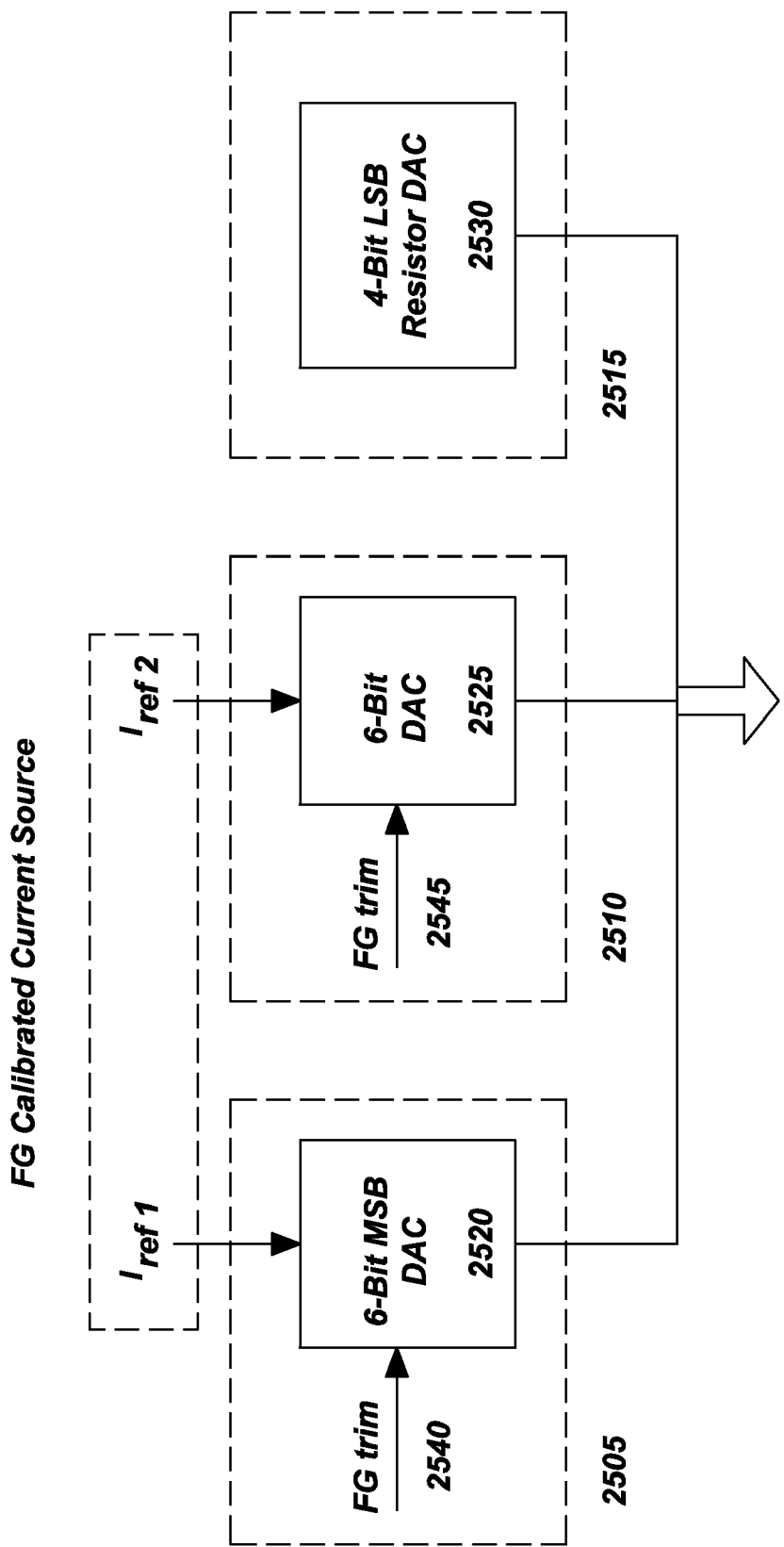
FIG. 25 shows one implementation of 3-segment, 4-bit DACs.

Hybrid DAC's may also be used which take advantage of various combinations that can be optimized for the particular application. In one example, current-mode and resistor-ladder based DACs can be combined such as shown in FIG. 25. In FIG. 25, there are three blocks 2505, 2510 and 2515 wherein each block includes one or more DAC types. In this example, one block 2505 has a 6-bit MSB DAC, another block 2510 has a 6-bit DAC, and a third block 2515 includes a 4-bit LSB resistor ladder DAC. Other combinations of including the number and type of DACs is within the scope of the contemplated system. In this example, some of the blocks contain trim elements 2540, 2545 for individual trimming optimization. By choosing optimal currents, DAC partitioning, device size, and trim algorithms, optimal designs are achieved.

The present system and processes are flexible and can also be implementable in the latest technology. Floating gate technology has been widely deployed in flash memories and is gaining currency in analog and mixed-signal domains as a core trim element. For example, a standard floating gate transistor contains a control gate on top of the floating polysilicon gate. Information is stored in the gate as a threshold voltage, which can be programmed non-destructively by either injecting electrons into the gate or tunneling through the inter-poly dielectric. This allows for post-fabrication control of the threshold voltage of the transistor, thus allowing control of an important source of mismatch between transistors across a chip. However, standard CMOS processes do not offer a second control gate. Under these conditions, a series capacitor may be added to the gate to serve as the control gate for the FG transistor. A current source DAC with 14-bit precision has been reported based on such technology, an improvement of 4-6 bits over standard current source DACs. The resolution of the DAC is limited by mismatch and noise, wherein the deployment of programmable analog memory devices technology practically eliminates mismatch as the limiting factor. With a unit current of 40 uA for the MSB, the noise of the DAC can be limited to less than ~2 uV that is needed to achieve 18-bit precision. The resistor values in the LSB DAC can be chosen appropriately to ensure that the overall DAC resolution exceeds 16-bits in a 0.18 um CMOS process.

To achieve a speed exceeding 5MSPS, the slowest time constant in the DAC must be faster than ~1 MHz. The LSB current in the current source DAC with 40 uA MSB current would be ~10 nA. With this current, a parasitic capacitance of about 25 fF will result in a pole at ~3 MHz, still fast enough for this application. Using a 0.18 um process can allow the converter to reach these targets. Assuming MSB power of 40 uA, the overall power consumption of the 12-bit current source DAC is 80 uA (40 uA+20 uA+10 uA+ . . . ~80 uA). With the over-head for the current sources and the resistor string, the overall power budget of 100 uA can be met with this architecture. The 4-bit flash ADC is implemented with a floating gate based trim element for correcting offsets. Arrays of trim gates can be used in order to recalibrate the ADC range for recovery implementation.

Figure 26:
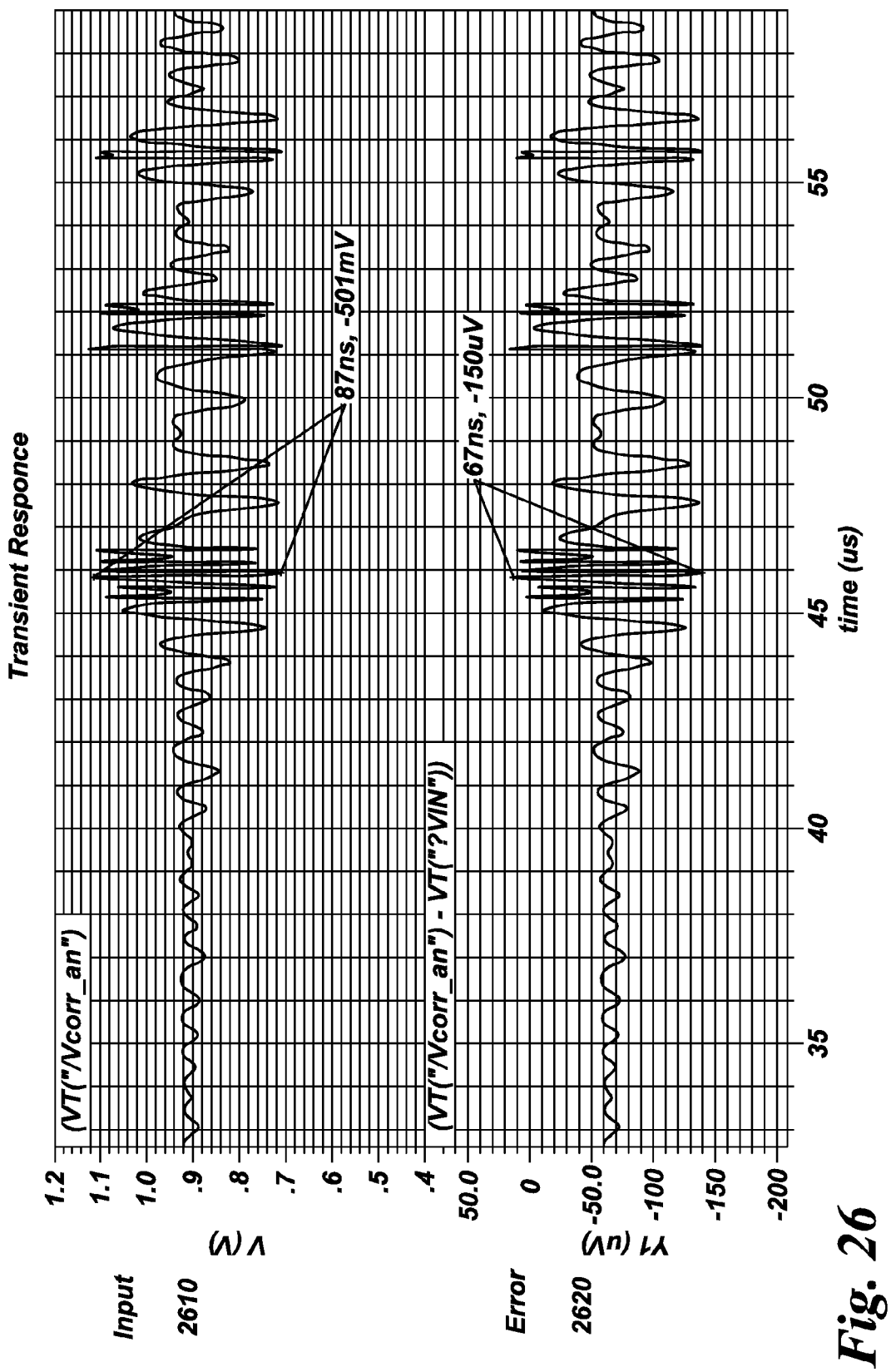
FIG. 26 is a simulation result showing the final corrected value accurate to 150 uV.

Referring to FIG. 26, a simulation of the converter using SPICE has shown acceptable results. These graphs show the response of a typical implementation. Initial input and output signals demonstrated an error of ~10 mV without correction. The error was corrected to about 300 uV with floating gate trimming. FIG. 26 shows the input signal 2610 corrected to an error signal 2620 with a value accurate to about 150 uV (which represents 11.5 bit accuracy on a 12-bit signal).

According to one ultrasound embodiment, the proper choice of analog filter, prediction filter coefficients and sampling rate, the ultrasound signal can be predicted quite well, even in the presence of noise. Furthermore, the use of the proper parameters can be deployed so that the over-range mode occurs infrequently. The converter therefore operates at a reduced overall power rate.

There is a need in certain industries and applications for small form factors, low power and reliable ADC. For example, in ultrasound imaging, there is a need for analog-to-digital converters with certain features such as high-speed (10 MSPS or more), large bit widths (8 bits or more), low power consumption (a few mW or less) and, in some cases, small area (10,000 um$^2$ or less).

Lower power ADCs are advantageous in portable and handheld systems, where battery life is an important feature for users. Such lower power ADCs are also advantageous in non-portable console systems. They would allow the analog receive signals produced by the transducer to be digitized in the transducer probe head instead of in the system console. Currently the low-level analog transducer signals must be transmitted over large numbers of coaxial cables, one for each system channel. This makes the transducer cable heavy and stiff, causing ergonomic problems and even cumulative injury for the user. These cable systems are also expensive. By digitizing the signals in the probe head, a smaller, lighter, more ergonomic, less expensive cable could be used between the probe head and the imager console, since digital signals generally require less complicated shielding than analog signals. Digitized signals could also be multiplexed together and transmitted over an optical fiber link or even over a radio-frequency (RF) link, which would eliminate the cable.

If ADCs with sufficiently low power and size can be designed, then the analog delays currently used in the subaperture beamformers in the probe head of transducers designed for real-time three dimensional ("volume") imaging can be replaced by digital beamformers. Digital beamforming would remove many of the limitations of the analog beamformers, such as delay resolution and bandwidth restrictions, and would considerably simplify the design of the circuits implementing the subaperture beamforming.

Furthermore, commonly used prediction filters are designed assuming a band-limited signal. They have gain outside the design passband of the filter, so that any out-of-band noise in the input signal is amplified. This increases the magnitude of the difference signal, requiring more bits in the core ADC and increasing power consumption and size. One embodiment adds an analog lowpass filter to compensate for the digital gain outside the prediction filter passband.

While numerous embodiments of the system have been illustrated and described, the invention is not so limited. Numerous modifications, variations, substitutions and equivalents will occur to those skilled in the art without departing from the spirit and scope of the present invention.

What is claimed is

1. A predictive Analog-to-Digital Converter system, comprising:
    a sampling section for producing a sampled analog input signal;
    a first summer section for combining the sampled analog input signal and an analog prediction signal to produce an analog prediction error signal;
    at least one error analog-to-digital converter for digitizing the analog prediction error signal, wherein a digital error signal output from said error analog-to-digital converter is one of a full bitwidth error signal during an over-range condition else a lower bitwidth error signal;
    a second summer coupled to the digital error signal output and a digital prediction signal, and generating a full bitwidth digital output signal; and
    a feedback section coupled to the digital output signal and providing the digital prediction signal and the analog prediction signal.

2. The system according to claim 1, wherein the feedback section comprises a prediction filter for calculating the digital prediction signal and a digital-to-analog converter providing the analog prediction signal.

3. The system according to claim 1, wherein the error analog-to-digital converter comprises a lower bitwidth analog-to-digital converter producing a lower bitwidth digital error signal, a full bitwidth analog-to-digital converter producing a full bitwidth digital error signal, and an over-range detector for processing the over-range condition.

4. The system according to claim 3, wherein the over-range condition occurs when the analog prediction error signal exceeds the range of the lower bitwidth analog-to-digital converter.

5. The system according to claim 3, wherein the over-range condition occurs when the lower bitwidth digital error signal exceeds the range of the lower bitwidth analog-to-digital converter.

6. The system according to claim 1, wherein the error analog-to-digital converter further comprising at least one buffer section coupled to the analog prediction error signal storing the analog prediction error signal.

7. The system according to claim 1, wherein the error analog-to-digital converter comprises a single analog-to-digital converter for digitizing the lower bitwidth digital error signal and the full bitwidth digital error signal.

8. The system according to claim 1, further comprising a control section determining the over-range condition.

9. The system according to claim 1, further comprising at least one of a bandwidth reduction filter and a Time Gain Control (TGC) amplifier coupled to the analog input signal.

10. The system according to claim 1, wherein said first summer section comprises a bank of comparators with programmable analog memory devices, wherein said programmable analog memory devices storing at least one of trim and reference voltages conversion reference levels.

11. The system according to claim 10, wherein said programmable analog memory devices are at least one bank of capacitors.

12. The system according to claim 11, wherein said capacitors are floating gate capacitors.

13. The system according to claim 11, further comprising a switching section and an additional bank of capacitors, wherein said switching section switchably couples between each said bank of capacitors to said comparators.

14. The system of claim 10 further comprising a programmable gain amplifier coupled to the sampled analog input signal, wherein the analog prediction signal is coupled to the programmable gain amplifier for producing the analog prediction error signal.

15. The system of claim 14, wherein said programmable gain amplifier changes a reference window size when over-range.

16. A method for producing a full bitwidth output using a predictive analog-to-digital converter, comprising:
    sampling an analog input signal to generate a sampled analog input signal;
    calculating an analog prediction error signal by combining an analog prediction signal with the sampled analog input signal;
    if the analog prediction error signal is within a range of a lower bitwidth analog-to-digital converter, digitizing the analog prediction error signal with the lower bitwidth analog-to-digital converter producing a lower bitwidth error signal and adding the lower bitwidth error signal to a prediction signal and outputting the full bitwidth output;
    if the analog prediction error signal is not within the range of the lower bitwidth analog-to-digital converter, performing one of digitizing the analog prediction error signal with a full bitwidth analog-to-digital converter producing a full bitwidth error signal and adding the full bitwidth error signal to the prediction signal and outputting the full bitwidth output or digitizing the sampled input signal with a full bitwidth analog-to-digital converter and outputting the full bitwidth output; and
    processing the full bitwidth output in a feedback section to produce the prediction signal and the analog prediction signal.

17. The method according to claim 16, further comprising filtering of the analog input signal.

18. The method according to claim 16, wherein the feedback section comprises a prediction filter for producing the digital prediction signal and a digital-to-analog converter for producing the analog prediction signal.

19. The method according to claim 18, further comprising segmenting the digital-to-analog converter into subsections processing smaller bitwidths.

20. The method according to claim 16, further comprising double buffering the analog prediction error signal.

21. The method according to claim 16, further comprising segmenting at least one of the lower bitwidth analog-to-digital converter and the full bitwidth analog-to-digital converter into subsections processing smaller bitwidths.

22. The method according to claim 21, wherein said subsections are comprised of different types of analog-to-digital converters.

23. The method according to claim 16, wherein calculating the analog prediction error signal is performed by a bank of comparators and at least one bank of programmable analog memory devices, further comprising storing calibration and conversion levels on the programmable analog memory devices.

24. The method according to claim 23, further comprising switching between said at least one bank of programmable analog memory devices and changing a reference window size when the analog prediction error signal is not within the range.

25. The method according to claim 23, further comprising switching a bias current on one or more of the analog-to-digital converters.

26. The method according to claim 16, further comprising operating at a higher sample rate to maintain a constant sample conversion rate when the analog prediction error signal is not within the range.

27. A predictive Analog-to-Digital Converter producing a full bitwidth digital output, comprising:
  a sampling section for producing a sampled analog input signal from an analog input signal;
  a first summer for producing an analog prediction error signal as the difference between the sampled analog input signal and an analog prediction signal;
  an error analog-to-digital converter coupled to said first summer, comprising:
    at least one analog-to-digital converter for producing a prediction error signal; and
    an over-range detector that determines whether the prediction error signal is outside a range of the analog-to-digital converter;
  wherein a digital error signal from said error analog-to-digital or converter is one of a full bitwidth digital error signal when said prediction error signal is outside the range or a low bitwidth digital error signal when said prediction error signal is within range;
  a second summer coupled to the digital error signal and a digital prediction signal, for producing the full bitwidth digital output; and
  a feedback section coupled to the full bitwidth digital output comprising a prediction filter for producing the digital prediction signal and a digital-to-analog converter for producing the analog prediction signal.

28. A predictive Analog-to-Digital Converter producing a full bitwidth output, comprising:
  a sampling section for producing a sampled analog input signal from an analog input signal;
  a first summer for producing an analog prediction error signal as the difference between the sampled analog input signal and an analog prediction signal;
  at least one analog-to-digital converter coupled to the first summer for producing a prediction error signal; and
  an over-range detector that determines whether the prediction error signal is outside a range of the analog-to-digital converter;
    if the prediction error signal is not within the range, digitize the analog input signal to produce the full bitwidth output;
    if the prediction error signal is within range, add a digitized analog prediction error signal with the digital prediction signal to produce the full bitwidth output;
  a feedback section coupled to the full bitwidth output comprising a prediction filter for producing the digital prediction signal and a digital-to-analog converter for producing the analog prediction signal.

* * * * *